United States Patent
Hiramatsu et al.

(10) Patent No.: US 7,531,390 B2
(45) Date of Patent: May 12, 2009

(54) CRYSTALLIZING METHOD, THIN-FILM TRANSISTOR MANUFACTURING METHOD, THIN-FILM TRANSISTOR, AND DISPLAY DEVICE

(75) Inventors: Masato Hiramatsu, Yokohama (JP); Hiroyuki Ogawa, Yokohama (JP); Masakiyo Matsumura, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 350 days.

(21) Appl. No.: 11/136,371

(22) Filed: May 25, 2005

(65) Prior Publication Data
US 2005/0272184 A1    Dec. 8, 2005

(30) Foreign Application Priority Data

| Jun. 4, 2004 | (JP) | ............................. 2004-196111 |
| Sep. 1, 2004 | (JP) | ............................. 2004-254283 |
| Sep. 30, 2004 | (JP) | ............................. 2004-286646 |
| Mar. 17, 2005 | (JP) | ............................. 2005-076190 |

(51) Int. Cl.
*H01L 21/00* (2006.01)

(52) U.S. Cl. ............... 438/149; 438/795; 257/E21.134; 257/E21.347

(58) Field of Classification Search ................ 438/149, 438/795; 257/E21.134, 347
See application file for complete search history.

(56) References Cited

U.S. PATENT DOCUMENTS

| 5,705,413 A * | 1/1998 | Harkin et al. ............... 438/155 |
| 5,966,596 A * | 10/1999 | Ohtani et al. ............... 438/155 |
| 6,285,055 B1 * | 9/2001 | Gosain et al. ............... 257/317 |
| 6,964,831 B2 * | 11/2005 | Lin ............................. 430/22 |
| 2004/0222187 A1 * | 11/2004 | Lin ............................. 216/65 |
| 2004/0235276 A1 * | 11/2004 | Lin ............................. 438/487 |

FOREIGN PATENT DOCUMENTS

| CN | 1465092 A | 12/2003 |
| WO | WO 03/023866 A1 | 3/2003 |

OTHER PUBLICATIONS

Wenchang Yeh, et al. "Proposed Sample Structure for Marked Enlargement of Excimer-Laser-Induced Lateral Grain Growth in Si Thin Films", Jpn. Appl. Phys., vol. 41, 2002, pp. 1909-1914.

(Continued)

*Primary Examiner*—Charles D. Garber
*Assistant Examiner*—Stanetta D Isaac
(74) *Attorney, Agent, or Firm*—Oblon, Spivak, McClelland, Maier & Neustadt, P.C.

(57) ABSTRACT

A crystallizing method of causing a phase shifter to phase-modulate a laser beam whose wavelength is 248 nm or 300 nm or more from an excimer laser unit into a laser beam with a light intensity profile having a plurality of inverted triangular peak patterns in cross section and of irradiating the pulse laser beam onto a substrate to be crystallized for crystallization. The substrate to be crystallized is such that one or more silicon oxide films which present absorption properties to the laser beam and differ in the relative proportions of Si and O are provided on a laser beam incident face.

1 Claim, 13 Drawing Sheets

OTHER PUBLICATIONS

M. Hiramatsu, et al. "Effect of Stacked Capping Layer for Phase-Modulated Excimer Laser Crystallization Method"; Extended Abstracts (The 63$^{rd}$ Autumn Meeting, 2002); The Japan Society of Applied Physics; No. 2; p. 779; 26a-G-2.

Y. Taniguchi, et al. "Duty Modulation Optics for Phase-Modulated Excimer Laser Projection Annealing"; Extended Abstracts (The 51$^{st}$ Spring Meeting, 2004); The Japan Society of Applied Physics and Related Societies No. 2; p. 929; 28a-ZG-3.

* cited by examiner

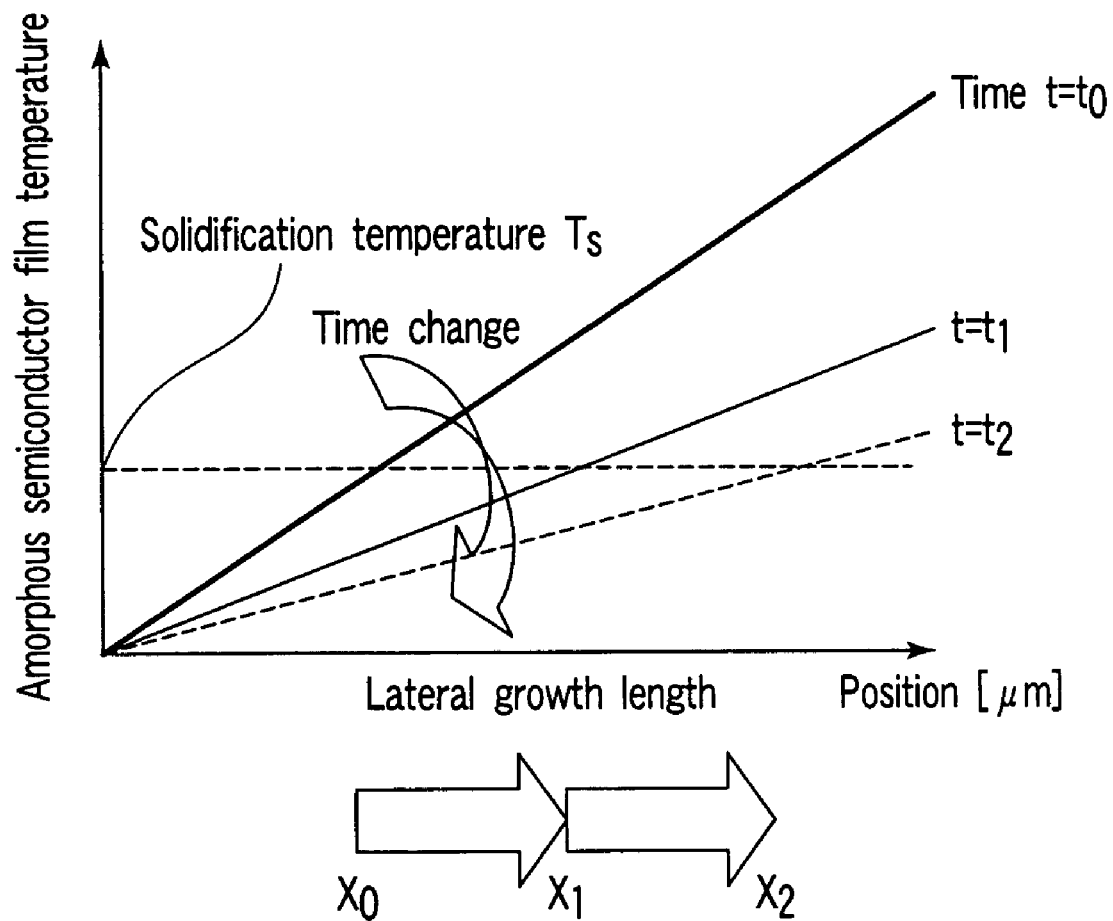
F I G. 14

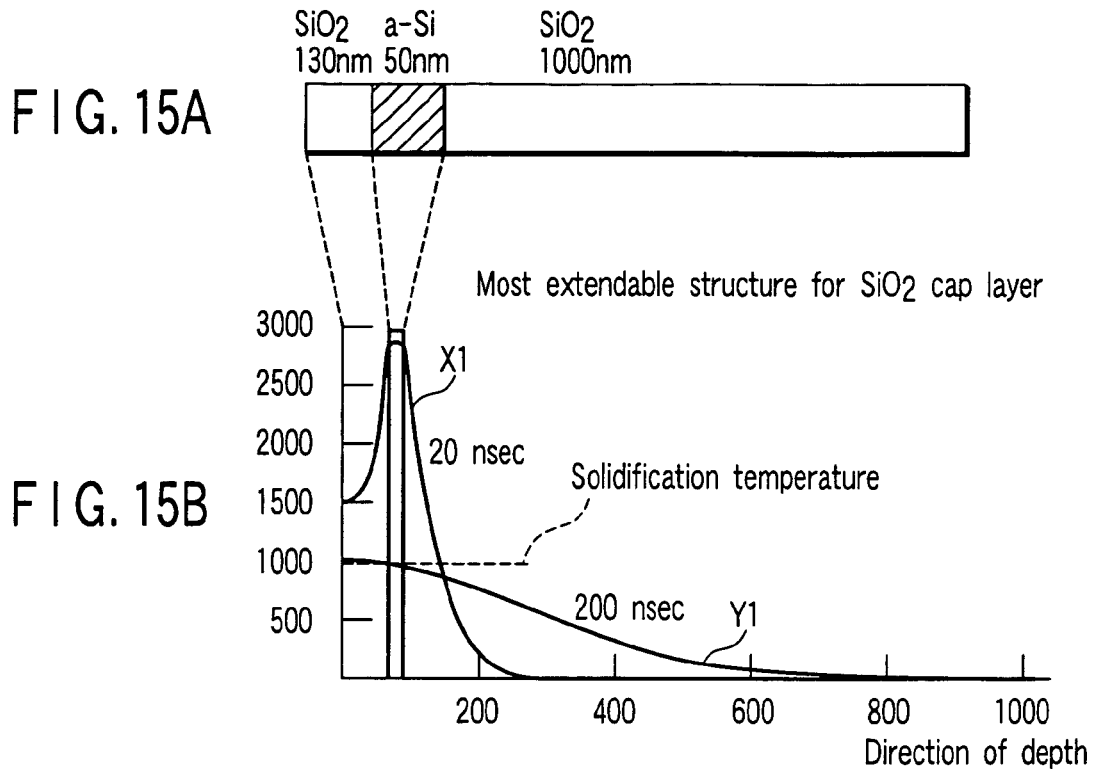
FIG. 15A
FIG. 15B
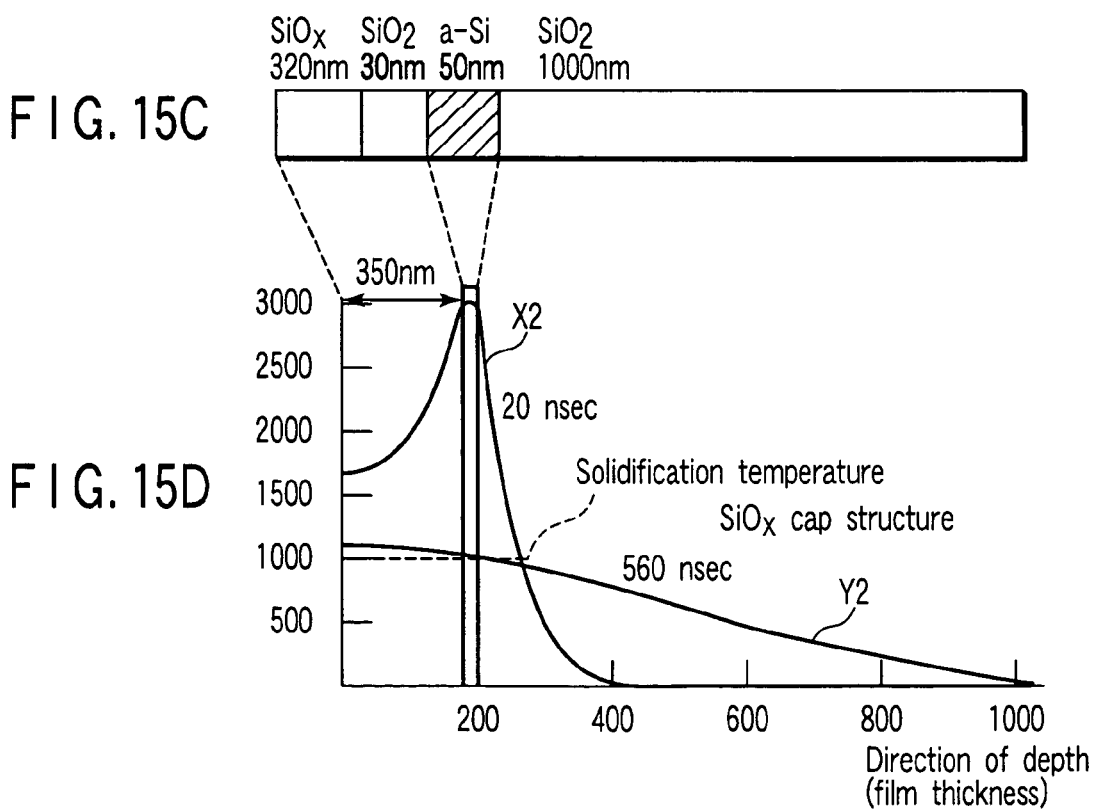
FIG. 15C
FIG. 15D

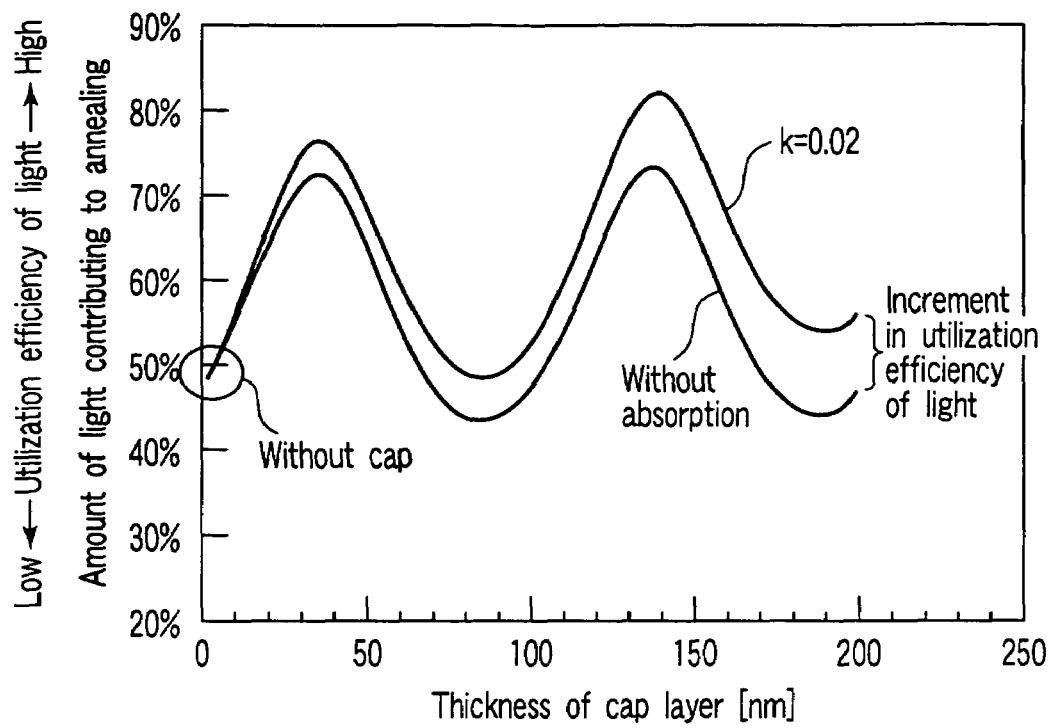
F I G. 16
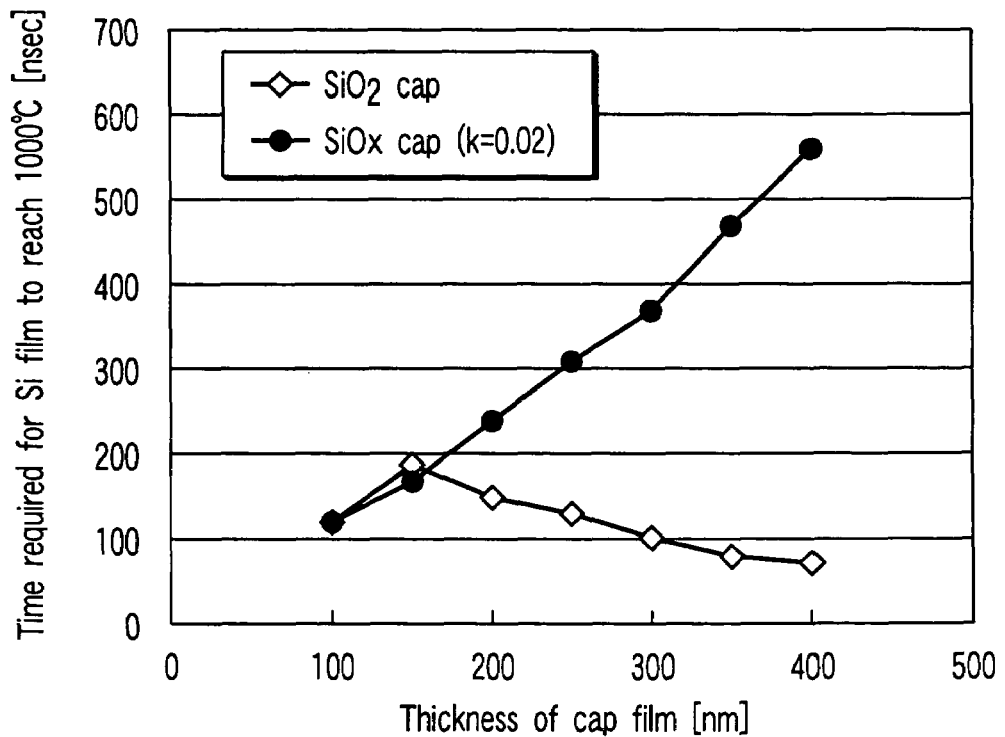
F I G. 17

CRYSTALLIZING METHOD, THIN-FILM TRANSISTOR MANUFACTURING METHOD, THIN-FILM TRANSISTOR, AND DISPLAY DEVICE

CROSS-REFERENCE TO RELATED APPLICATIONS

This application is based upon and claims the benefit of priority from prior Japanese Patent Applications No. 2004-196111, filed Jun. 4, 2004; No. 2004-254283, filed Sep. 1, 2004; No. 2004-286646, filed Sep. 30, 2004; and No. 2005-076190, filed Mar. 17, 2005, the entire contents of all of which are incorporated herein by reference.

BACKGROUND OF THE INVENTION

1. Field of the Invention

This invention relates to a crystallizing method suitable for use in a display device, such as a liquid crystal or organic electroluminescence (EL), a thin-film transistor manufacturing method, a thin-film transistor, and a display device.

2. Description of the Related Art

The driving circuit for a display device, such as a liquid-crystal display device, has been fabricated by using an amorphous semiconductor film formed on a glass substrate. With the expansion of the IT services market, information handled in this field has been digitized and speeded up and therefore display devices have been required to provide higher picture quality. One of the means for meeting the requirement is such that, for example, switching transistors for switching the corresponding pixels are fabricated by using a crystallized semiconductor, thereby making the switching speed faster, which enables higher picture quality.

One known means for crystallizing an amorphous silicon layer formed on a glass substrate is the excimer laser annealing method (ELA method). The grain size of a polycrystalline silicon obtained by the ELA method is about 0.1 μm. When a thin-film transistor (TFT) is formed in the crystallized region, a large number of grain boundaries are included in the channel region of a single thin-film transistor, which gives an electron field-effect mobility of 200 $cm^2/Vs$. This mobility is much inferior to that of a MOS transistor fabricated by using a silicon single crystal.

The inventors of this invention have developed the industrial technique for forming as large a crystal grain as enables a channel region of at least one thin-film transistor to be formed by irradiating an amorphous silicon layer with a laser beam. Forming a TFT in a single crystal grain has no adverse effect from the grain boundaries on transistor characteristics which differ from the conventional transistor characteristics where the grain boundaries are formed in the channel region. In addition, the TFT characteristic is improved remarkably and a functional element, such as a processor, a memory, or a sensor, can be formed. As such a crystallizing method, the inventors have proposed the crystallizing method described in, for example, W. Yeh and M. Matsumura, Jpn. Appl. Phys. Vol. 41(2002)1909 and M. Hiramatsu, et al., Extended Abstracts (The $63^{st}$ Autumn Meeting, 2002); The Japan Society of Applied Physics No. 2, P779, 26a-G-2.

The document by W. Yeh and M. Matsumura has described a method of irradiating a laser beam phase-modulated at a fluence of 0.8 $J/cm^2$ to an amorphous silicon film via an SiON/$SiO_2$ cap layer or an $SiO_2$ cap layer, causing a Si grain to grow laterally in parallel with the film, which crystallizes the amorphous silicon film.

The document by M. Hiramatsu, et al., has described a method of irradiating a laser beam homogenized and intensity-modulated to an amorphous silicon film via an $SiO_2$ cap layer, while the substrate is being heated, which causes the amorphous film to grow in crystal laterally.

In the method of the document by W. Yeh and M. Matsumura, a Si grain whose size is equal to or larger than 10 μm can be obtained. Since very small grains with small sizes appear near the large grains whose sizes have become larger, it is expected that the grains with large grain size are formed in the same size so as to be relatively uniform (or close) as an overall film structure. The SiON cap film is capable of changing the absorption spectrum by changing the ratio of oxygen atoms to nitrogen atoms in the film. However, even a film whose optical bandgap is the smallest (SiNx without oxygen) has about 5 eV (This bandgap energy corresponds to nearly 240 nm in wavelength). Thus, it can be used for KrF laser whose wavelength is 248 nm among excimer lasers, but is difficult to use for XeCl laser now often used in mass production whose wavelength is 308 nm, because it becomes transparent. This is a problem.

Furthermore, in the methods in the document by W. Yeh and M. Matsumura and the document by M. Hiramatsu, et al., the substrate has to be heated to a high-temperature region to make crystal grains larger in its size, preventing the requirement for low-temperature treatment from being met, which is a problem. For example, a conventional crystallizing apparatus 100 shown in FIG. 11 is a unit which irradiates a pulse laser beam 105 emitted from a KrF excimer laser unit 104 to a substrate 103 to be crystallized which is heated to a high-temperature region by a heater 102 built in a table 101, thereby crystallizing the substrate. The pulse laser beam 105 is a laser beam passed through an optical system composed of a concave lens 106, a convex lens 107, and a phase shifter 108. A power supply 110 controlled by a controller 109 supplies electricity to the heater 102, which has the capability of heating the substrate 103 to a temperature range from 300 to 750 degrees.

Since the substrate heating temperature may exceed, for example, 500 degrees, general-purpose glass (e.g., soda glass) or plastic is liable to deteriorate or deform due to heating. Therefore, to use these materials as substrates for a liquid-crystal display (LCD), low-temperature treatment is an indispensable condition. Large-screen LCDs have been strongly required to be lighter. Therefore, their substrates tend to be made thinner and therefore are liable to deform due to heating, which makes low-temperature treatment an indispensable condition to secure the flatness of the thin substrates.

Furthermore, since heating the substrate 103 increases the power consumption, electric power saving particularly required in industrialization is not satisfied. Moreover, when a laser light source with a wavelength of, for example, 248 nm shorter than 300 nm is used (e.g., refer to Y. Taniguchi, et al., Extended Abstracts (The $51^{st}$ Spring Meeting, 2004); The Japan Society of Applied Physics and Related Societies No. 2, P929, 28a-ZG-3), light absorption takes place in an optical system composed of a concave lens 106, a convex lens 107, a phase shifter 108, and a mirror. In the optical system, heat corresponding to the amount of light absorbed is generated. In the heat generation, the temperature rises with time, which results in the blurring of the focal point of the lens and the displacement of the crystallization position. The displacement leads to a shift in the crystallization region. When a transistor circuit is formed, the channel region is formed off the crystallization region in the exposure process, wit the result that the yield becomes worse in the mass production process. Furthermore, in a display device, it is understood that display irregularity and color nonuniformity occur, which causes poor display.

BRIEF SUMMARY OF THE INVENTION

It is, accordingly, an object of the present invention to provide a crystallizing method capable of realizing crystallization with a large grain size even at room temperature, achieving electric power saving, and reducing the occurrence of the displacement of crystallization, a thin-film transistor manufacturing method, a thin-film transistor, and a display device.

According to an aspect of the present invention, use of a laser beam with wavelength of the lowest light absorption possible in a crystallizing optical system prevents the optical system from generating heat and reduces the occurrence of the displacement of crystallization. The present invention provides a crystallizing method of achieving crystallization with a large grain size at relatively low electric power by providing at least one SiOx film (x is less than 2) on the laser beam incident face of a non-single-crystal semiconductor film and causing a part of the crystallizing laser beam to be absorbed. The present invention further provides a thin-film transistor manufacturing method, a thin-film transistor, and a display device.

According to an aspect of the present invention, there is provided a crystallizing method of irradiating a laser beam onto the incident face of a non-single-crystal semiconductor film to crystallize the semiconductor film, the laser beam having a light intensity profile including a plurality of inverted triangular peak patterns in cross section, the crystallizing method comprising providing a cap film which presents absorption properties to the laser beam, on the laser beam incident face of the non-single-crystal semiconductor film.

According to another aspect of the present invention, there is provided a crystallizing method of irradiating a laser beam onto the incident face of a non-single-crystal semiconductor film to crystallize the semiconductor film, the laser beam having a wavelength of 300 nm or more and a light intensity profile including plural types of inverted triangular peak patterns in cross section, the crystallizing method comprising providing a cap film which presents absorption properties to the laser beam, on the laser beam incident face of the non-single-crystal semiconductor film.

According to still another aspect of the present invention, there is provided a crystallizing method of irradiating a laser beam onto the incident face of a non-single-crystal semiconductor film to crystallize the semiconductor film, the laser beam having a wavelength of 300 nm or more and a light intensity profile including plural types of inverted triangular peak patterns in cross section, the crystallizing method comprising providing at least one layer of SiOx film on the laser beam incident face of the non-single-crystal semiconductor film, x being less than 2. Preferably the x is 1.4 to 1.9, and more preferably it is 1.4 to 1.8.

According to still another aspect of the present invention, there is provided a crystallizing method of irradiating a laser beam onto the incident face of a non-single-crystal semiconductor film to crystallize the semiconductor film, the laser beam having a wavelength of 300 nm or more and a light intensity profile including a plurality of inverted triangular peak patterns in cross section, the crystallizing method comprising providing a silicon dioxide film and at least one layer of SiOx film on the laser beam incident face of the non-single-crystal semiconductor film, x being less than 2. Preferably the x is 1.4 to 1.9, and more preferably it is 1.4 to 1.8.

According to still another aspect of the present invention, there is provided a crystallizing method of irradiating a laser beam onto the incident face of a non-single-crystal semiconductor film to crystallize the semiconductor film, the laser beam having a wavelength of 300 nm or more and a light intensity profile including plural types of inverted triangular peak patterns in cross section, the crystallizing method comprising providing at least one layer of silicon oxide films differing in the relative proportions of Si and O from silicon dioxide film on the laser beam incident face of the non-single-crystal semiconductor film.

According to still another aspect of the present invention, there is provided a crystallizing method of irradiating a laser beam onto the incident face of a non-single-crystal semiconductor film to crystallize the semiconductor film, the laser beam having a wavelength of 300 nm or more and a light intensity profile including plural types of inverted triangular peak patterns in cross section, the crystallizing method comprising providing at least one layer of silicon dioxide film and at least one layer of silicon oxide film differing in the relative proportions of Si and O from silicon dioxide film on the laser beam incident face of the non-single-crystal semiconductor film.

According to still another aspect of the present invention, there is provided a thin-film transistor manufacturing method comprising a step of forming at least one layer of SiOx film (x is less than 2) on the laser beam incident face of a non-single-crystal semiconductor film provided on a substrate; a step of irradiating a homogenized pulse laser beam whose wavelength is 248 nm or 300 nm or more onto the non-single-crystal semiconductor film via the SiOx film, allowing the SiOx film not only to absorb a part of the pulse laser beam and generate heat but also to melt the irradiated part of the non-single-crystal semiconductor film, and forming a crystallization region in the non-single-crystal semiconductor film after the pulse laser beam is cut off; and a step of forming a thin-film transistor aligned with the crystallization region.

According to still another aspect of the present invention, there is provided a substrate to be crystallized, comprising a non-single-crystal semiconductor film provided on a substrate; and at least one layer of SiOx film provided on the laser beam incident face of the non-single-crystal semiconductor film, x being less than 2. Preferably the x is 1.4 to 1.9, and more preferably it is 1.4 to 1.8.

According to still another aspect of the present invention, there is provided a substrate to be crystallized, comprising a non-single-crystal semiconductor film provided on a substrate; and one or more silicon oxide films differing in the relative proportions of Si and O provided on the laser beam incident face of the non-single-crystal semiconductor film.

According to still another aspect of the present invention, there is provided a thin-film transistor comprising a channel region, part of or all of a source region, and part of or all of a drain region which are provided in a crystallization region fabricated by the crystallizing method of claim 1; a gate insulating film formed on the channel region, source region, and drain region; and a gate electrode formed on the gate insulating film.

According to still another aspect of the present invention, there is provided a display device comprising a channel region of thin-film transistors for switching pixels which are formed in a crystallization region fabricated by the crystallizing method of claim 1.

In this specification, "non-single-crystal semiconductor film" is a thin film to be crystallized, such as amorphous semiconductor (e.g., an amorphous silicon film), polycrystalline semiconductor (e.g., a polysilicon film), or a composite structure of these.

At least one layer of the silicon oxide films is a film which presents light absorption properties to the laser beam. The silicon oxide films have a film thickness of 100 nm to 1500 nm. The laser beam is a pulse laser beam modulated so as to have a light intensity profile with a repetitive pattern where light intensity alternates between monotonous increase and monotonous decrease. The laser beam is homogenized in light intensity before entering the phase shifter.

In the present invention, "crystallization" means a crystal grows from the nucleus when the film to be crystallized is melted and solidified.

According to aspect of the present invention, it is possible to provide a crystallizing method capable of realizing crystallization with a large grain diameter even at room temperature, achieving electric power saving, and reducing the occurrence of the displacement of crystallization, a thin-film transistor manufacturing method, a substrate to be crystallized, a thin-film transistor, and a display device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2A is a plane view of the phase shifter, FIG. 2B is a cross-sectional view of FIG. 2A, FIG. 2C shows a light intensity profile of the laser beam passed through the phase shifter and phase-modulated, and FIG. 2D shows a light intensity profile of the laser beam of FIG. 2C three-dimensionally;

FIG. 14 shows the relationship between the length of lateral crystal growth of the amorphous semiconductor film of the substrate to be crystallized of FIGS. 3A and 3B and the temperature of the amorphous semiconductor film;

FIGS. 15A to 15D shows the light absorption effect by the second cap insulating film of FIGS. 3A and 3B in comparison with the characteristic of a conventional cap film;

FIG. 16 shows the relationship between the thickness of the cap film of the substrate to be crystallized of FIGS. 3A and 3B and the amount of light contributing to annealing in comparison with the characteristic of a conventional cap film; and FIG. 17 is a characteristic curve diagram of the time from immediately after a laser is irradiated until the amorphous semiconductor film reaches 1000 degrees with respect to the film thickness of the first and second films of FIG. 3A.

DETAILED DESCRIPTION OF THE INVENTION

Figure 1:
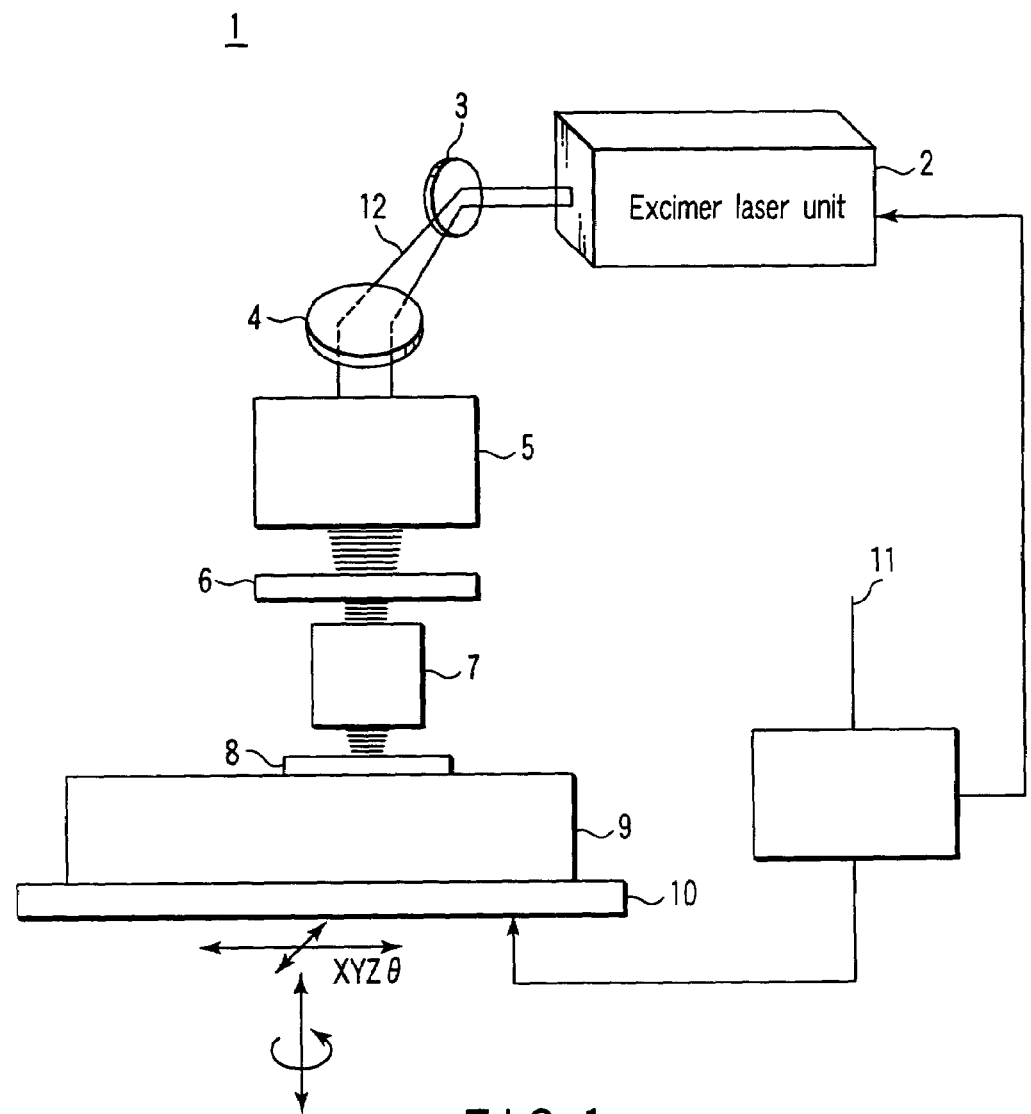
FIG. 1 is a block diagram showing the configuration of a crystallizing apparatus to help explain a crystallizing method according to the present invention.

Hereinafter, referring to the accompanying drawings, a preferred embodiment of the present invention will be explained.

First, the technical terms used in this specification are defined as follows. "Lateral growth" means that, when a film to be crystallized is melted and solidified, the growth of a crystal grain progresses laterally along the film surface. "Input fluence" is a measure representing the energy density of a laser beam for crystallization. It is obtained by integrating the amount of one shot pulse laser beam energy per unit area. Specifically, it means the average light intensity of a laser beam measured at a light source or in the irradiation region (irradiation field).

"Phase shifter" is an example of a phase modulation optical system. It is a spatial intensity modulation optical element for modulating the phase of the laser beam and is distinguished from a phase shift mask used in the exposure step in the photolithographic process. For example, a phase shifter is such that a step is formed in a quartz substrate acting as a transparent medium. The desired step on desired position of the phase sifter is formed into such a size as phase of incident light shifts at a specific phase angle, for example, at 180 degrees by such a process as etching.

"Projection lens" is an optical system for projecting an image formed by phase shifter onto the surface of the substrate. When the irradiation size is small, a telecentric lens is generally used. Use of a telecentric lens makes it possible to prevent the size of the projected image from changing even if the distance between the substrate and the lens changes a little. Therefore, a singe-sided telecentric lens system which is parallel only on the substrate side or a double-sided telecentric lens which is parallel on both of the substrate side and the light source side is used. In a mass production apparatus, a long, narrow beam, or a "longitudinal" beam, is often used as a irradiation beam. Although not shown in the specification, this can be realized by using a "hog-backed" projection lens which has a lens structure of telecentric et al. only on the short sides, preventing the lens effect on the long sides.

In this embodiment, using a laser beam with the lowest light absorption possible for a crystallization optical system prevents the optical system from generating heat even with a high-energy laser beam, which decreases the occurrence of the displacement of the crystallization position. The embodiment is related to a crystallizing method of crystallizing a large-size grain with the laser beam energy density for the crystallization with relatively low electric power by providing at least a silicon dioxide film and at least one layer of SiOx film (x is less than 2) on the laser beam incident face of a non-single-crystal semiconductor film and causing a part of the crystallizing laser beam to be absorbed. First, the configuration of a projection crystallizing apparatus to help explain the crystallizing method will be described, referring to FIG. 1.

The crystallizing apparatus 1 comprises an excimer laser unit 2 which emits a laser beam whose wavelength is 300 nm or more. The crystallizing apparatus 1 further comprises an concave lens 3, a convex lens 4, a homogenizer 5, a phase shifter 6, a projection lens 7, a table 9 on which a substrate to be crystallized is placed, an XYZθ stage 10, and a controller 11, which are provided on the optical axis of the laser unit 2 in that order. That is, the crystallizing apparatus 1 irradiates a pulse laser beam 12 onto the substrate 8 on the table 9 by means of the crystallizing optical system composed of the concave lens 3, convex lens 4, homogenizer 5, phase shifter 6, and projection lens 7.

The excimer laser unit 2 which emits a laser beam whose wavelength is 300 nm or more outputs a laser beam with low light absorption in the crystallizing optical system composed of the concave lens 3, convex lens 4, homogenizer 5, phase shifter 6, and projection lens 7. For example, an XeCl excimer laser unit which emits a laser beam whose wavelength is 308 nm is best suited for the excimer laser unit 2.

In the outgoing optical path of the excimer laser unit 2, there is provided an attenuator (not shown) which adjusts the amount of laser light to a specific light fluence. In the outgoing optical path of the attenuator, the homogenizer 5 is provided via the concave lens 3 and convex lens 4. The homogenizer 5 has the function of leveling a pulse laser beam 12 in an irradiation region. That is, the homogenizer 5 is an optical system which homogenizes the incident angle and the light intensity to the phase shifter 6 of the pulse laser beam 12 passing through the homogenizer 5.

Figure 2A:
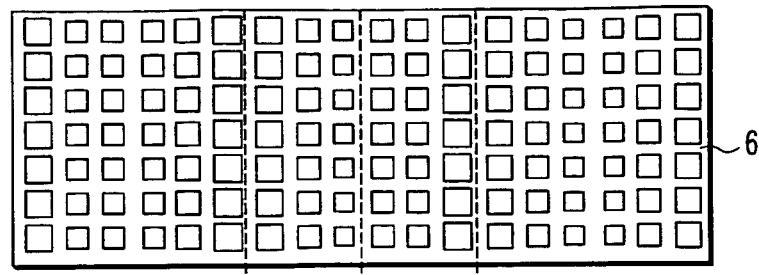
FIGS. 2A to 2D shows a configuration of the phase shifter of FIG. 1 to help explain a light intensity profile modulated by the phase shifter.
Figure 2B:
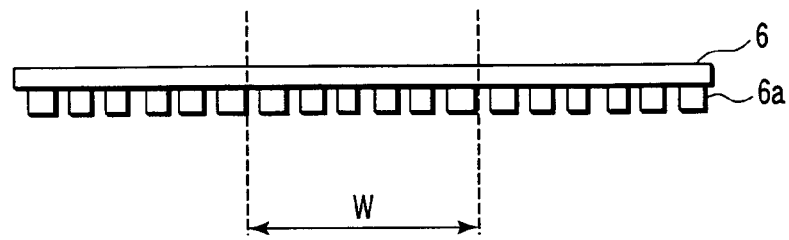

The homogenized pulse laser beam 12 is further subjected to, for example, 180° phase shift at the phase shifter 6 shown in FIG. 2A. The phase shifter 6 is made of a transparent medium. The phase shifter 6 with a plurality of linear steps 6a arranged in parallel as shown in FIGS. 2A and 2B produces phase differences in the pulse laser beam 12 at the steps 6a. The pulse laser beam 12 is phase-modulated due to the phase differences, which subjects the pulse laser beam 12 to light intensity modulation. As a result, a light intensity profile BP (Beam Profile) with a repetitive pattern where monotonic increase and monotonic decrease are alternated as shown in FIG. 2D is formed in the irradiation section. In the embodiment, the spacing W between phase shifters 6 is set to 100 μm.

Figure 2C:
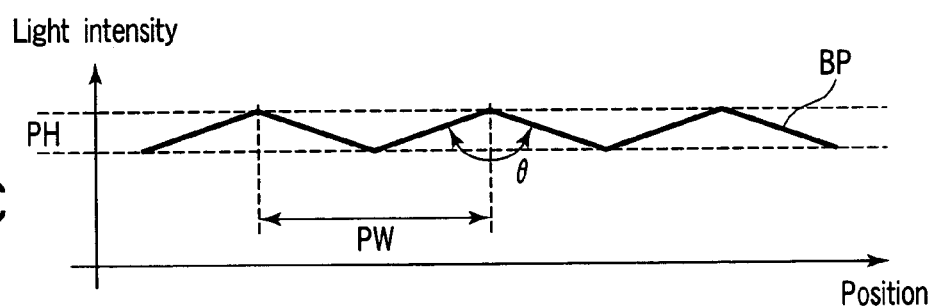
Figure 2D:
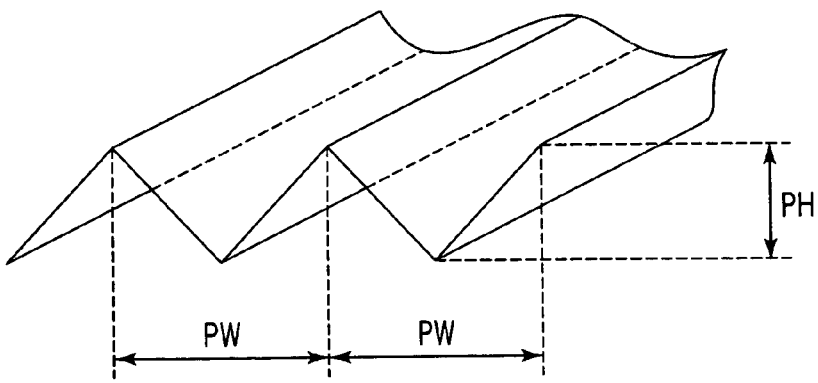

FIG. 2A is a plane view of the phase shifter 6, FIG. 2B is a cross-sectional view of FIG. 2A, FIG. 2C is a waveform diagram to help explain light intensity profile of the pulse laser beam 12 passed through the phase shifter 6, and FIG. 2D is a perspective view of FIG. 2C. The light intensity profile BP (Beam Profile) of FIG. 2C takes the form of a V-shaped groove light intensity profile of FIG. 2D when being shown three-dimensionally in a perspective view. Such a phase shifter 6 is a area ratio (duty) modulation phase shifter 6. The duty-modulation pattern is formed by changing the area of the surface of the steps 6a as shown in FIG. 2A to obtain a light intensity profile having a plurality of peak patterns whose cross section is inverted triangular as shown in FIG. 2C. In the light intensity profile of the inverted triangular peak patterns in cross section, the pitch height (PH) is the same and the pitch width (PW) is also the same.

The pulse laser beam 12 subjected to light intensity modulation at the phase shifter 6 enters the projection lens 7. The projection lens 7 is provided so as to form an image of the phase shifter 6 on the top surface of the substrate to be crystallized 8. The projection lens 7 is an optical system which provides the image at the same magnification or reduces the image at a reduction ratio of, for example, 1/5. For example, a projected image corresponding to an area 100 $\mu m^2$ of the surface of the steps 6a of the phase shifter 6 is 4 $\mu m^2$.

Figure 3A:
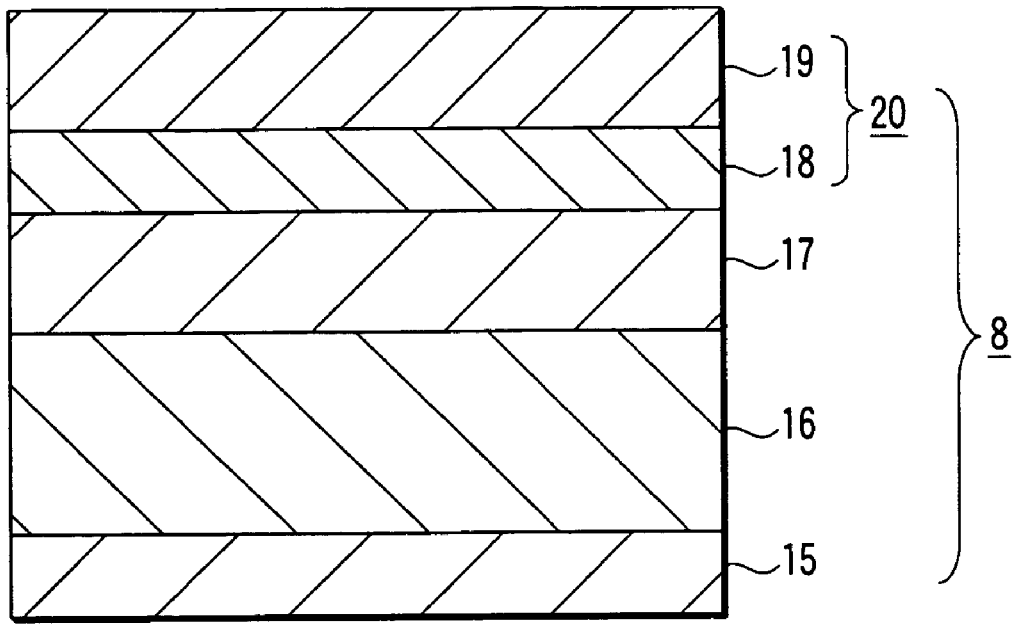
FIGS. 3A and 3B are cross-sectional views to help explain the substrate to be crystallized of FIG. 1.

FIG. 3A shows the configuration of the substrate to be crystallized 8. The substrate is characterized in that the cap film absorbs a part of the crystallizing laser beam. The cap film which presents light absorption properties to the crystallizing laser beam makes it possible to obtain an equivalent lateral growth distance with a low input fluence for crystallization.

Specifically, the substrate to be crystallized 8 is a structure obtained by stacking a substrate protecting film 16, a non-single-crystal semiconductor film, such as an amorphous semiconductor film 17, a first cap insulating film 18, and a second cap insulating film 19 one on top of another in that order on a substrate 15 made of insulating material or semiconductor, such as a silicon substrate. A cap film 20 in the embodiment is composed of the first cap insulating film 18 and the second cap oxide film 19 with light absorbability. The second cap oxide film 19 of light absorbability is, for example, at least one layer of SiOx film (x is less than 2) or is at least one layer of silicon oxide film differing in the relative proportions of Si and O from silicon dioxide film.

The substrate protecting film 16 is a material having the effect of preventing impurities from infiltrating from the substrate 15 and storing heat generated in the crystallizing process of the amorphous semiconductor film 17. The substrate protecting film 16 is, for example, a silicon dioxide film of 1000 nm in thickness. The substrate protecting film 16 may be composed of not only one layer but also two layers. To prevent impurities from infiltrating from the substrate 15, the formation of an SiNx layer on the substrate 15 and further an $SiO_2$ layer is particularly effective. Moreover, the substrate protecting layer 16 may be such that a silicon dioxide film ($SiO_2$) is formed to a thickness of, for example, 30 nm on a thermally-oxidized film. The amorphous semiconductor film 17, which is a film to be crystallized, is made of amorphous silicon of, for example, 50 nm to 200 nm in film thickness.

Figure 3B:
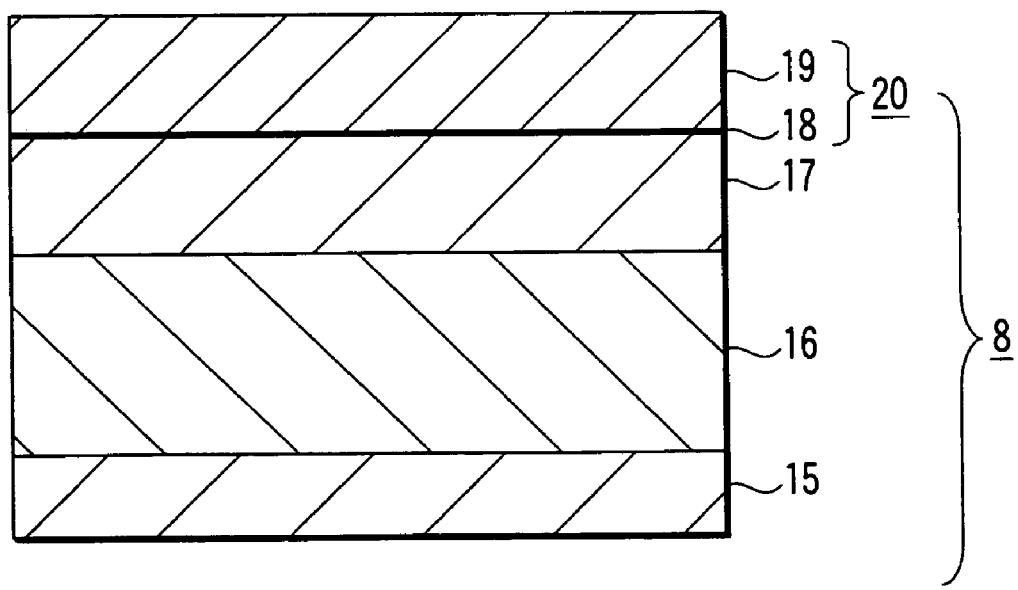

The first cap insulating film 18 is composed of a silicon dioxide film of, for example, 20 to 200 nm or 30 nm in film thickness. FIG. 3B shows a stacked state in a case where the first cap insulating film 18 is absent or very thin. In FIG. 3A, since the second cap oxide film 19 with light absorbability is, for example, at least one layer of SiOx film (x is less than 2), the interface can be unstable when the SiOx film is stacked directly on the amorphous semiconductor film 17. To avoid this possibility, the second cap insulating film 18 made of a chemically stable silicon dioxide film has been inserted. The film 18 is not always needed. If needed, it may sometimes be a very thin film. Therefore, for example, in addition to the structure of FIG. 3A, the structure of FIG. 3B may be used.

The second cap insulating film 19, which is a light absorption film that absorbs a part of the laser beam 12 and that is increased in temperature, is composed of a silicon oxide film of, for example, 500 nm in film thickness. It is desirable that the film thickness of the silicon oxide film should be in the range of 100 to 1500 nm, from the viewpoints of light-absorption property and heat storage characteristic. If the film thickness decreases below 100 nm, the amount of heat generated by the light absorption of the silicon oxide film runs short and therefore the amount of the storaged heat becomes insufficient, which makes it impossible to obtain large crystal grains of a desired size. If the film thickness exceeds 1500 nm, the amount of light transmitted decreases, making it difficult for the pulse laser beam with sufficient fluence to reach the amorphous semiconductor film 17 to be crystallized, which makes it impossible to achieve the object of crystallization sufficiently.

Next, the embodiment of the method of manufacturing the substrate to be crystallized 8 having such a double-structure cap film 20 will be explained more concretely.

On the substrate 15, such as an insulating substrate made of, for example, a glass substrate, an insulating layer serving as the substrate protecting film 16 is formed. Not only a glass substrate, a quartz substrate, and a plastic substrate but also a metal substrate, a silicon substrate, and a ceramic substrate on whose surface an insulating film is formed may be applied to the substrate 15. It is desirable that a low alkali glass substrate, such as a Corning #1737 substrate, should be used as the glass substrate. The substrate protecting film 16 is formed by growing a silicon dioxide film to a film thickness in the range of 50 to 2000 nm, for example, to a film thickness of 100 nm, by plasma enhanced chemical vapor deposition method.

On the substrate protecting film 16, an amorphous silicon film is formed as the amorphous semiconductor film 17. In a method of forming an amorphous silicon film, an amorphous Si film is formed to a film thickness of 200 nm by, for example, plasma enhanced chemical vapor deposition method. On the amorphous Si film, a cap film 20 is formed.

In the cap film 20, a silicon dioxide film is formed as the first cap insulating film 18 on the amorphous Si film. The silicon dioxide film is formed by plasma enhanced chemical vapor deposition method using, for example, $SiH_4$ and $N_2O$ as material gases. The silicon dioxide film that was close to the stoichiometric composition ratio has a film thickness of 30 nm. In addition, on the first cap insulating film 18, the second cap insulating film 19, for example, a silicon oxide film, is formed as a light absorption layer.

The silicon oxide film is formed by plasma-enhanced chemical vapor deposition method using, for example, $SiH_4$ and $N_2O$ as material gases. The silicon oxide film is formed into a film thickness of 500 nm, differing in flow rate ratio from the silicon dioxide film. Then, the thin films 16 to 19 formed on the substrate 15 are subjected to dehydrogenation. The dehydrogenation process is the process of heating in an atmosphere of nitrogen at 570 degrees for two hours. In this way, the substrate to be crystallized 8 is formed. On the top surface of the substrate 8, for example, a silicon oxide film differing in the relative proportions of Si and O from silicon dioxide film is provided as a light absorption layer.

The cap film 20 with light absorption properties needs to have such a film thickness as assures the function of absorbing a part of the incident pulse laser beam 12 homogenized and storing the generated heat. The time of the heat storage is a time that enables a large grain growth.

The table 9, which is mounted on the XYZθ stage 10, can be not only moved along the X axis and the Y axis on a horizontal plane and further along the Z axis perpendicular to the horizontal plane but also rotated on the Z axis through an angle of θ. A power supply circuit for the XYZθ stage 10 is connected to the output section of the controller 11 in such a manner that the X-axis driving mechanism, Y-axis driving mechanism, Z-axis driving mechanism, and θ-rotation driving mechanism are controlled independently. A power supply circuit for the excimer laser unit 2 is connected to the output section of the controller 11 in such a manner that the oscillation timing, pulse interval, and output magnitude of the laser beam 12 are controlled.

Figure 4:
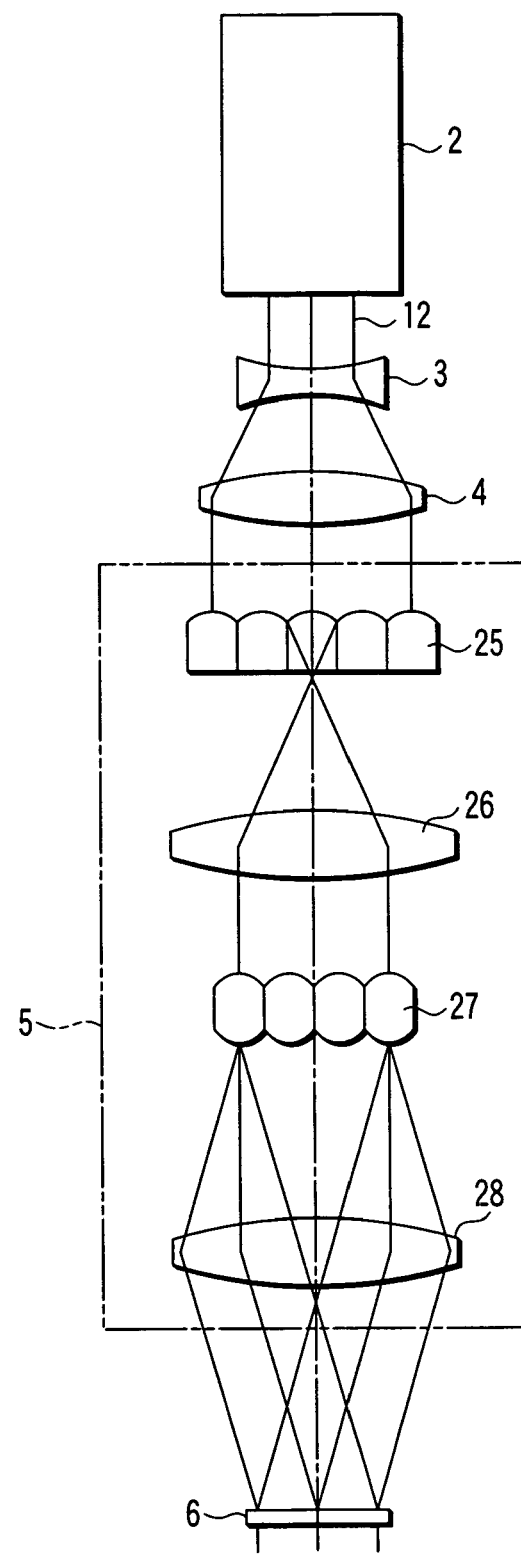
FIG. 4 is a diagram to help explain the optical system of the homogenizer of FIG. 1.

Next, referring to FIG. 4, the optical system of the homogenizer 5 will be explained concretely. The same parts as those in FIG. 1 are indicated by the same reference numerals. To avoid repetitive explanation, a detailed explanation of them will be omitted. The optical system includes as the excimer laser light source 2 an excimer laser light source which emits an excimer laser pulse laser beam whose wavelength is equal to or longer than 300 nm, for example, 308 nm of XeCl excimer laser. The laser beam emitted from the excimer laser light source 2 is expanded via the optical systems 3, 4 composed of beam expanders and then enters the homogenizer 5. The homogenizer 5 is composed of a first cylindrical lens 25, a first condenser optical system 26, a second cylindrical lens 27, and a second condenser optical system 28.

The pulse laser beam which has entered the homogenizer 5 enters the first cylindrical lens 25. On the back focal surface of the first cylindrical lens 25, a plurality of light sources are formed. The luminous fluxes from the plurality of light sources illuminate the incident face of the second cylindrical lens 27 in an overlapping manner via the first condenser optical system 26. As a result, more light sources than those on the back focal surface of the first cylindrical lens 25 are formed on the back focal surface of the second cylindrical lens 27. The luminous fluxes from the light sources formed on the back focal surface of the second cylindrical lens 27 illuminate the phase modulation element 6 (phase shifter) in an overlapping manner via the second condenser optical system 28.

The first cylindrical lens 25 and first condenser optical system 26 constitute a first homogenizer. The first homogenizer homogenizes the incident angle on the phase shifter 6.

The second cylindrical lens 27 and second condenser optical system 28 constitute a second homogenizer. The second homogenizer homogenizes the light intensity (laser fluence) in each position of the surface of the phase shifter 6. In this way, the illumination system irradiates the phase shifter 6 with a beam which has a substantially homogeneous light intensity profile.

It is desirable that the pulse laser beam 12 entering the phase shifter 6 should be homogenized in incident angle by the first cylindrical lens 25 and first condenser optical system 26 serving as a homogenizing optical system (homogenizer) and further homogenized in light intensity by the second cylindrical lens 27 and second condenser optical system 28.

Specifically, the pulse laser beam 12 homogenized in incident angle and light intensity at the homogenizer passes through the phase shifter 6, which produces an ideal light intensity profile where light intensity alternates between monotonous increase and monotonous decrease as shown in FIG. 2C. The light intensity profile BP of FIG. 2C, which has an inverted triangular cross section, has the maximum peak value and minimum peak value at projecting parts and has no flat part. In addition, the light intensity profile BP has an equal pitch height PH and an equal pitch width PW. Specifically, since the phase-modulated homogenized laser beam includes no high-order vibrational component, when the substrate to be crystallized 8 is irradiated with the pulse laser beam 12, a large crystal grain of a size corresponding to the pitch width W between steps 6a-6a of the phase shifter 6 can be grown laterally in theory. At this time, since thermal energy transferred to the crystallized film from the cap films by the heat generation effect and heat storage effect resulting from the light absorption of the cap films, a series of processes of melting→solidification and crystallization→lateral crystal growth are promoted, which makes the size of the crystal grain larger. In the light intensity profile BP of FIG. 2C, as the angle θ of the peak part grows sharper, the film ablation is liable to take place. Therefore, it is desirable that the light intensity profile should be set so as to make the angle θ of the peak part as gentle as possible.

While in the embodiment, the projection method of projecting a modulated beam profile from the phase shifter 4 onto the substrate 5 has been explained, the present invention is not limited to this. For instance, the invention may be applied to a proximity method in which the phase shifter 4 is provided above the substrate 5 with a specific distance between them.

Next, a crystallizing method in the crystallizing apparatus 1 will be explained concretely. The same parts as those in FIGS. 1 to 4 are indicated by the same reference numerals. A detailed explanation of them will be omitted to avoid repetition. The controller 11 is controlled automatically according to a program previously stored. The controller 11 transfers the substrate to be crystallized 8 to a predetermined position of the table 9 and controls, for example, an electrostatic chuck or a vacuum chuck to temporarily fix the substrate 8. According to a predetermined procedure, the controller 11 positions the substrate 8 temporarily fixed.

The controller 11 performs control to oscillate the excimer laser unit 2. As a result, the excimer laser unit 2, such as an XeCl excimer laser unit 2, oscillates and emits pulse laser 12. The pulse laser 12 produces a pulse laser beam 50 with a pulse width of, for example, 30 nsec and an irradiate laser fluence of, for example, 1 J/cm$^2$. The pulse laser beam 12 is diverged by the concave lens 3 and converged by the convex lens 4 and enters the homogenizer 5. The homogenizer 5 homogenizes the incident angle and light intensity of the incoming pulse laser beam 12.

The homogenizer 5 causes the homogenized pulse laser beam 12 to enter the phase shifter 6. The phase shifter 6 emits a pulse laser beam 12 with a light intensity profile which has a plurality of inverted triangular peak patterns in cross section. The pulse laser beam 12 emitted from the excimer laser unit 2 has its light intensity and incident angle homogenized at the homogenizer 5. The homogenized beam 12 is then modulated by the phase shifter 6 into a light intensity profile having a plurality of inverted triangular peak patterns in cross section. An image of the light intensity profile is formed by the projection lens 7 on the substrate 8 to be crystallized. As a result, the amorphous semiconductor film 17 of the image forming section is melted and, after the laser beam is cut off, is crystallized.

In the crystallization process, the amorphous semiconductor film 17 is crystallized in the following process in the substrate 8. When the pulse laser beam 12 with a light intensity profile having a plurality of inverted triangular peak patterns in cross section enters the substrate 8 to be crystallized, the light of the pulse laser is absorbed in part by the second cap insulating film 19, which is a light absorption film provided on the incident face of the pulse laser beam of the amorphous semiconductor film 17 of the substrate 8. Most of the remaining part of the pulse laser beam 12 enters the amorphous semiconductor film 17 and melts only the irradiated part immediately in the direction of depth.

The temperature rise of the amorphous semiconductor film 17 at this time is transferred to the substrate insulating film 16, the first cap insulating film 18 and the second cap insulating film 19, and heat is stored. This heat storage effect and a heat storage effect caused by the pulse laser beam absorption of the second cap insulating film 19 can prevent that irradiated part of the temperature of the amorphous semiconductor film 17 drops sharply when the pulse laser beam is cut off. Therefore, these effects make it possible to form a region with large grains.

The non-single-crystal semiconductor film 52 is melted immediately in the direction of depth. When the pulse laser beam is cut off, solidification (or crystallization) is started from the inverse peak point at which the fluence becomes the lowest, with the result that a crystal grain grows in a lateral direction (or in a direction perpendicular to the thickness of the film 52). In the crystal growth, since the lateral growth of the crystal grain is promoted by the heat storage effect of the substrate insulating film 16, first cap insulating film 18, and second cap insulating film 19, the size of the crystal grain after final solidification becomes larger, which realizes the formation of single crystal over a wide region of the irradiated part. The heat storage effect of the second cap insulating film 19 makes it possible to obtain an equivalent lateral growth distance with low input fluence for crystallization.

Such a crystallization process is carried out continuously or intermittently all over a predetermined region of the non-single-crystal semiconductor film 52 by relatively moving the excimer laser light source 2 and the substrate 8 to be crystallized, for example, as a result of the controller 11 moving the XYZθ stage 10.

After having directed tremendous efforts toward forming closely as large a crystal grain as enables at least one channel region of thin-film transistor to be formed, the inventors have come to the conclusion that it is impossible to make a crystal grain larger closely by the irradiation of a conventional parallel pulse laser beam. Strictly, the cause of this has not been made clear. However, what will be described below is roughly speculated.

Figure 5A:
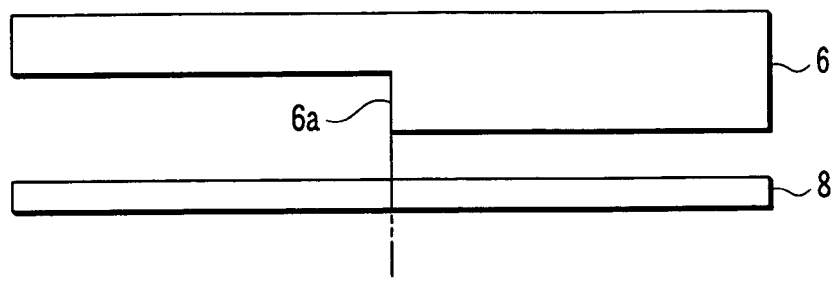
FIGS. 5A and 5B are diagrams to help explain the optical characteristic of the phase shifter of FIG. 1.
Figure 5B:
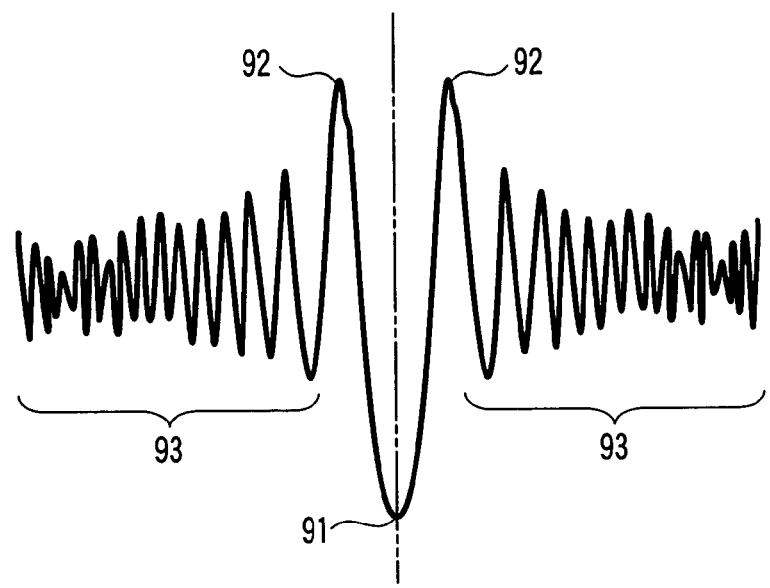

The light intensity profile after a parallel pulse laser beam passes through one step 6a of the phase shifter 6 is shown in FIG. 5B. In the light intensity profile, the components contributable to lateral crystal growth are from the first inverse peak wave 91 to the next peak wave 92. High-order waves 93 (vibrations; interference fringes) outside these peak waves can be considered to be components suppressing lateral crystal growth. Therefore, it was found that crystal grains grow in a very short time from inverse peak waves 93 of high-order vibrations other than the main inverse peak wave 91 attributing to lateral crystal growth, producing fine crystal grains, which makes it impossible to make a large grain size uniformly and closely all over the film. That is, it was found that, since a beam obtained by phase-modulating a parallel pulse laser beam (or an unhomogenized beam) includes high-order vibrations 93, a crystal grain with a large grain size cannot be formed.

The crystallization can be achieved by irradiating the homogenized pulse laser beam onto the amorphous semiconductor film via a phase modulation optical system and an insulating film with light absorption properties and arranging crystal grains with a large grain size closely. In other words, a pulse laser beam with a light intensity profile not including high-order vibrations 93 of FIG. 5B as shown in FIG. 2C is irradiated onto an amorphous semiconductor film, which makes it possible to arrange crystal grains with a large grain size closely (uniformly).

In the crystallizing method of the embodiment, a pulse laser beam with an optimized light intensity profile, that is, a pulse laser beam as shown in FIG. 2C from which the effect of high-order vibrations 93 shown in FIGS. 5A and 5B has been removed, is irradiated onto an amorphous semiconductor film 17 (an amorphous film or a polycrystalline film) to be crystallized via a silicon oxide film acting as the second cap insulating film 19 serving as a light absorption film differing in the relative proportions of Si and O from silicon dioxide film. As a result, the silicon oxide film increases in temperature all over the film by light absorption. The heat is stored in the silicon oxide film for a specific period. The stored heat energy from the silicon oxide film is applied to the amorphous semiconductor film 17 for a heat storage time, heating the film 17. The heating from the silicon oxide film during the heat storage time lengthens the lateral growth length of the amorphous semiconductor film 17, with the result that crystal grains with a large grain size are formed in such a manner they are arranged closely.

Specifically, in the method of the embodiment, a film with large grains of Si each of which is a single crystal or close to a single crystal can be obtained at R.T, and using a low input fluence without externally heating the substrate 8 differently from a conventional method, because of the heat supplying effect directly from the cap insulating film as a light absorption film to the laser beam incident force of the a-Si semiconductor film 17 of the substrate 8.

FIG. 3A is an embodiment of the substrate 8 to be crystallized. The substrate 15 made of insulating material or semiconductor is, for example, a silicon substrate 48. The substrate protecting film 16 is a silicon dioxide film of 1000 nm in thickness. The amorphous semiconductor film 17, which is a semiconductor film to be crystallized, is an amorphous silicon film of 50 nm to 200 nm in film thickness. The first cap insulating film 18 is a silicon dioxide film of 30 nm in film thickness. The second cap insulating film 19, which is a light absorption film that absorbs a part of the laser beam 12 and transform the absorbed beam into heat, is a silicon oxide film of 500 nm in thickness differing in the relative proportions of Si and O from silicon dioxide film.

The method of manufacturing the substrate 8 to be crystallized with the cap film 20 will be explained more concretely. The pulse laser beam 50 homogenized by the crystallizing apparatus 1 of FIG. 1 was phase-modulated. The phase-modulated laser beam 50 was irradiated onto the substrate 8 having the double-structure cap insulating films 18, 19, thereby crystallizing the amorphous silicon film in a lateral growth manner.

The table 9 was moved by the XYZθ stage 10 along each of the X axis, Y axis, Z axis, and θ rotation axis, thereby positioning the substrate 8 very accurately with respect to the crystallizing optical system.

The controller 11 causes the excimer laser light source 2 to emit a pulse laser beam 12 with an irradiation laser fluence of 620 mJ/cm$^2$. The pulse laser beam 12 is magnified at the concave lens 3 and convex lens 4 constituting a beam expander. Then, the magnified beam 12 is homogenized in incident angle at a first homogenizer section composed of the cylindrical lens 25 and condenser lens 26 and then is further homogenized in light intensity at a second homogenizer section composed of the cylindrical lens 27 and condenser lens 28. Furthermore, the homogenized pulse laser beam 12 is subjected to 180° phase modulation at the phase shifter 6 having steps 6a, passes through the projection lens 7 and then enters the silicon oxide film 19 on the substrate to be crystallized 8. As a result, the irradiated part of the amorphous silicon film was melted and dropped in temperature when the pulse laser beam was cut off. In the temperature dropping process, crystallization progressed laterally. The average crystal grain size of the crystal grain was as long as about 8 μm.

Figure 6:
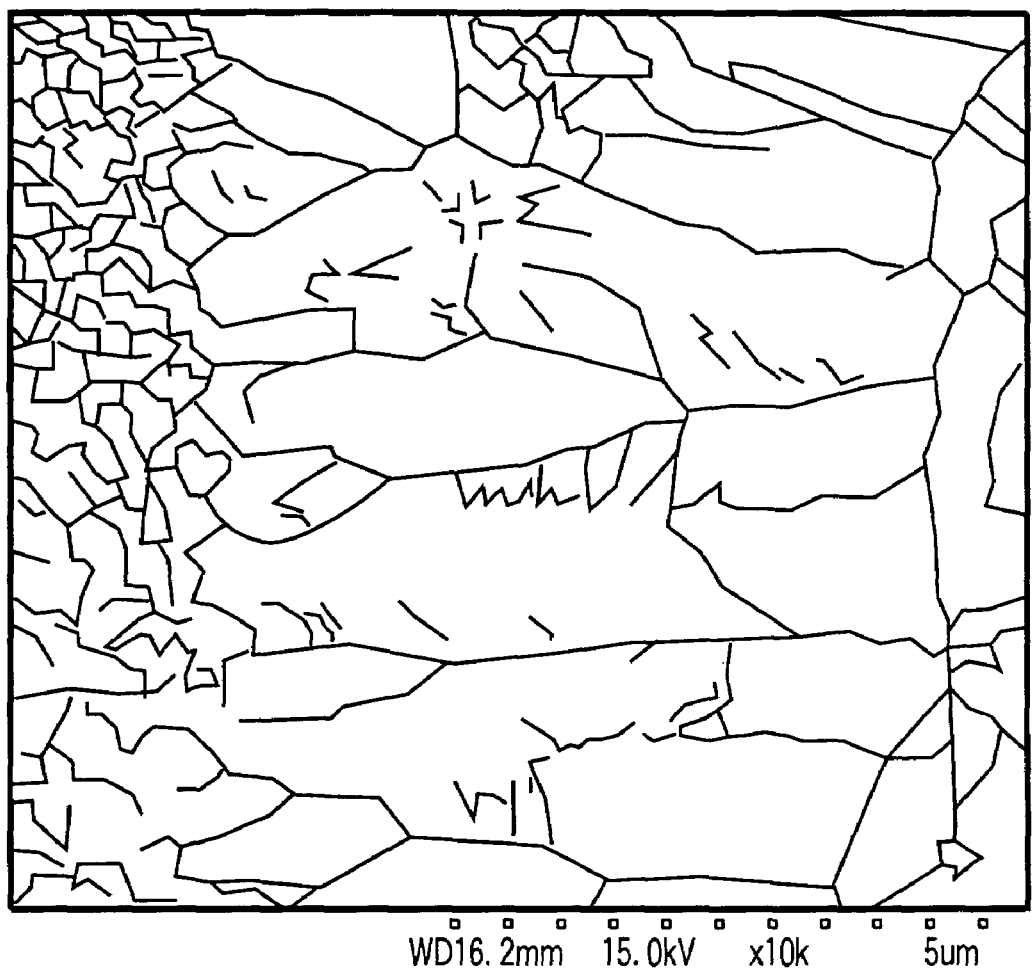
FIG. 6 shows an SEM image to help explain the surface shape of the crystallization region of the substrate to be crystallized by the crystallizing apparatus of FIG. 1.

FIG. 6 shows an SEM image of an Si thin film crystallized by the crystallizing method. As seen from the SEM image, the formation of an Si crystal grown laterally into a large crystal grain was verified. Moreover, it was verified that the laterally grown Si crystals extended laterally very well from the central crystal nucleus and were arranged closely.

After one shot irradiation of the pulse laser beam 1, the controller 11 translated the substrate 8 by a specific pitch distance automatically according to a previously stored program, caused the excimer laser unit 2 to irradiate another shot of the pulse laser beam 12 onto the substrate 8, thereby growing a crystal laterally in the irradiation region of the amorphous silicon film, which formed a larger crystal grain of Si crystallization region in the amorphous silicon film. A similar operation was repeated, thereby growing crystals one after another in a predetermined element formation region of the amorphous silicon film.

Figure 7:
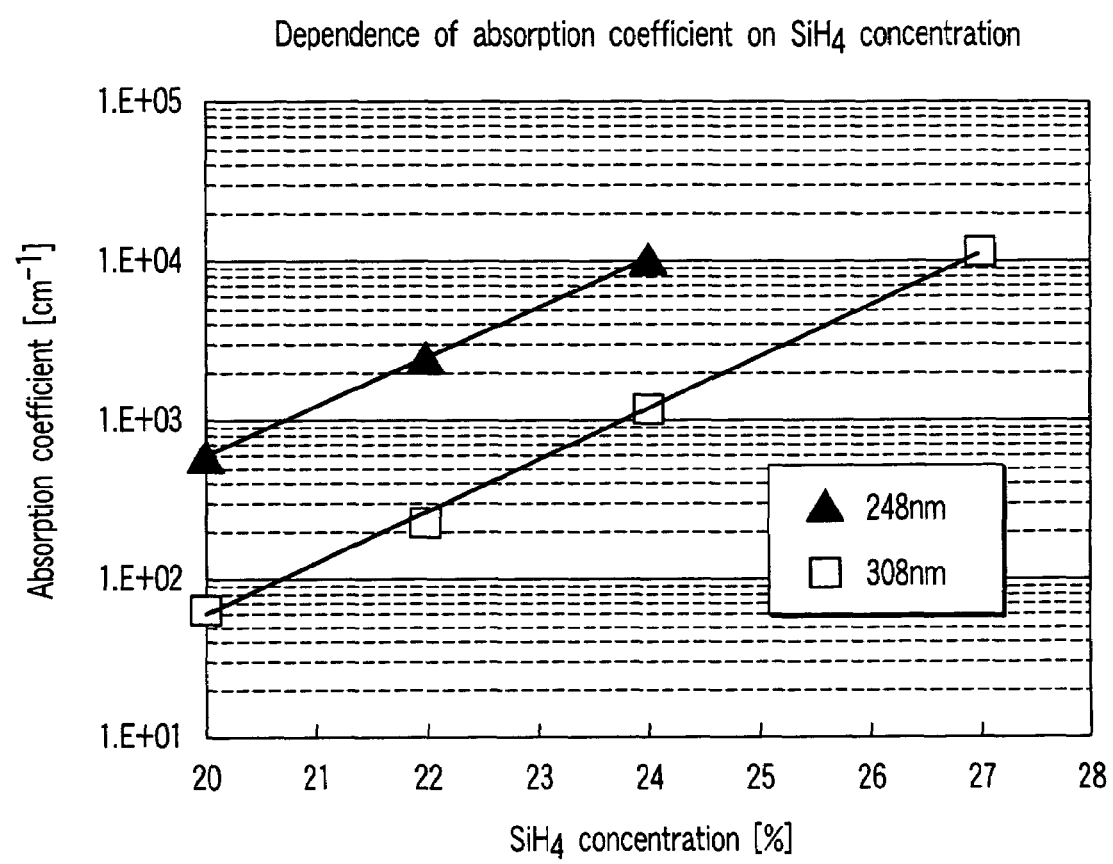
FIG. 7 is a characteristic diagram showing the dependence of $SiH_4$ gas concentration during deposition for the second cap insulating film of FIGS. 3A and 3B to obtain the desired light absorption properties.

FIG. 7 is a characteristic diagram with the flow rate ratio of silane gas to nitrous oxide gas ($N_2O$) on the abscissa axis and the absorption coefficient (cm$^{-1}$) of the resulting silicon oxide film on the ordinate axis. The absorption coefficient corresponds to a wavelength of 248 nm as the wavelength of KrF excimer laser and a wavelength of 308 nm as the wavelength of XeCl excimer laser. FIG. 7 is a characteristic diagram obtained by replacing the KrF excimer laser unit with the XeCl excimer laser unit in the crystallizing apparatus 1 of FIG. 1.

As seen from FIG. 7, the absorption coefficient can be changed by changing the flow ratio at each of the wavelengths. The reason for this may be that, since changing the flow ratio increases the amount of Si in the second cap insulating film 19 as compared with the ratio of the number of silicon atoms to that of oxygen atoms is about 1:2 in the silicon dioxide film acting as the first cap insulating film 18, the $SiO_2$ film with very low absorption is changed toward to an a-Si film with very high absorption in terms of absorption coefficient.

Furthermore, since the absorption coefficient can be changed at each wavelength, even if the wavelength of laser beam is changed, setting the absorption coefficient of the silicon oxide film to a desired value enables the same effect to be obtained. Although not shown in the embodiment, the optical bandgap of $SiO_2$ is about 9 eV (137 nm in terms of light wavelength) and the optical bandgap of a-Si is about 1.7 eV (727 nm in terms of light wavelength). Therefore, controlling the flow rate ratio enables the same effect to be obtained for beams whose wavelengths are between them.

Figure 12:
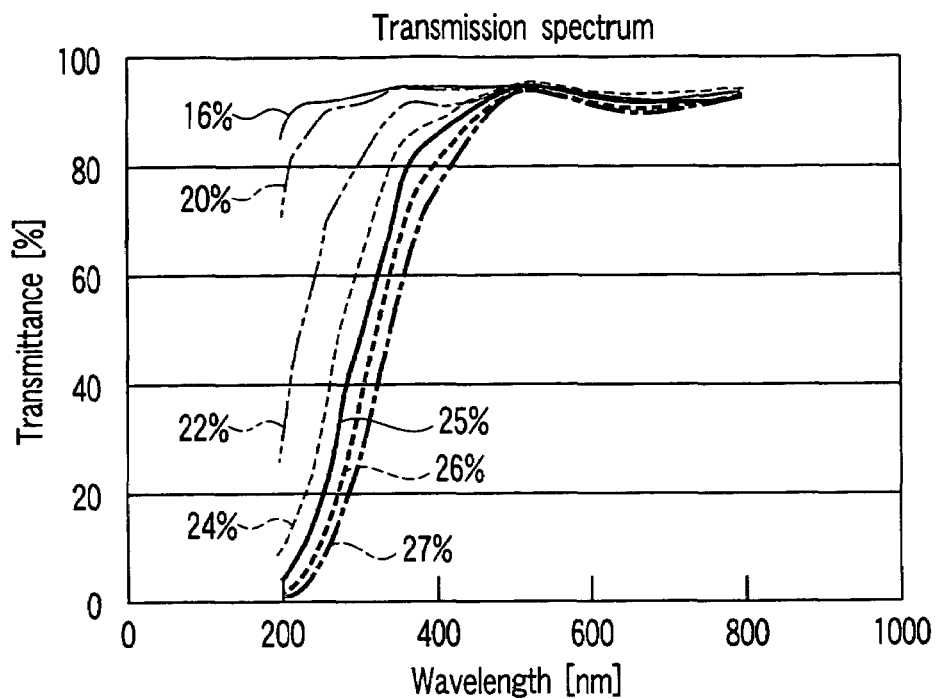
FIG. 12 shows a transmission spectrum when the concentration of $SiH_4$ gas used during deposition of the SiOx film of FIGS. 3A and 3B is changed.

The transmission spectrum of the SiOx film is shown in FIG. 12. FIG. 12 is a characteristic curve diagram showing the characteristic of transmittance for a wavelength when the concentration of $SiH_4$ gas during deposition is changed. The SiOx film was formed under the controlling so as to give about 7000 cm$^{-1}$ to α at each wavelength. In a sample of the embodiment, the lateral growth distance exceeded 8 μm. In contrast, the lateral growth distance of a comparative sample was a little under 3 μm.

From what has been described above, it has been verified that use of the method of the invention enables large crystal grains (with an average crystal grain diameter of 4 to 8 microns) to be grown laterally at a high padding density.

Figure 8:
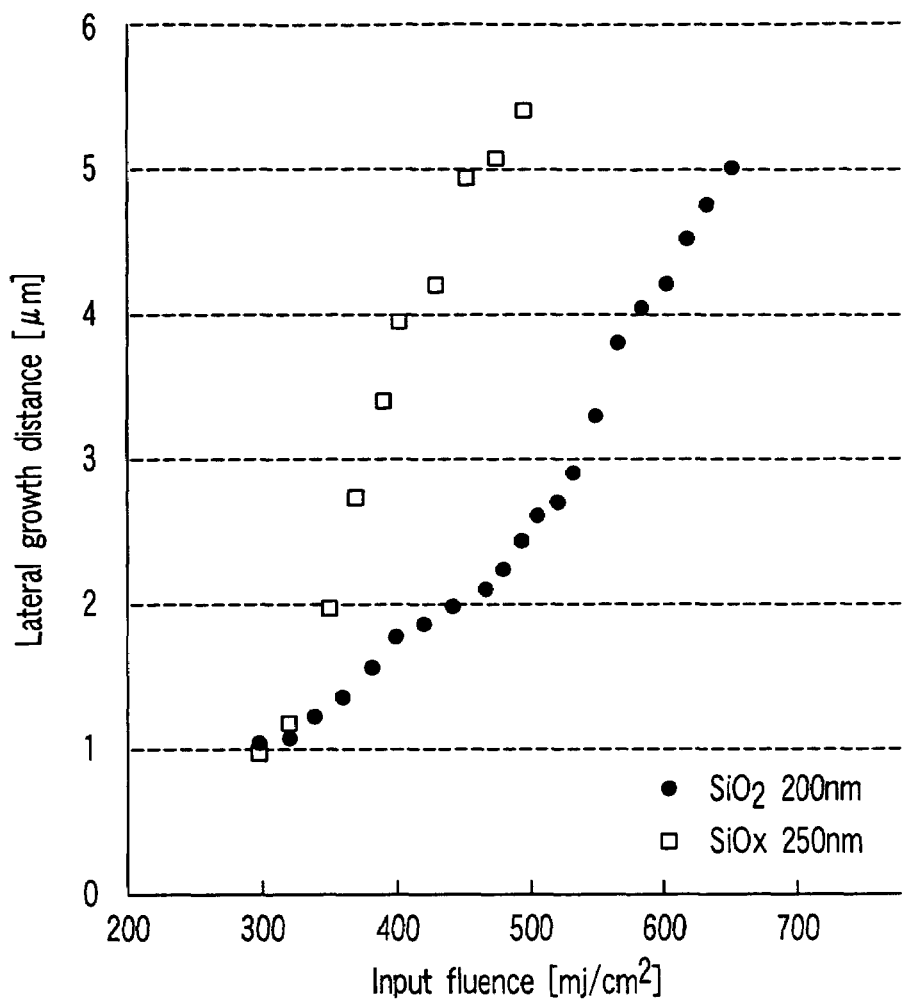
FIG. 8 is a characteristic curve diagram to help explain the energy saving effect by the second cap insulating film having the light absorption properties of FIGS. 3A and 3B.

FIG. 8 is a characteristic curve diagram showing the energy saving effect when the cap film is provided with light absorption properties. In FIG. 8, the abscissa axis shows the input fluence (mJ/cm$^2$) of the laser beam emitted from the excimer laser unit 2 and the ordinate axis shows the lateral growth distance (μm) when the amorphous semiconductor film 17 is crystallized. In FIG. 8, not only is the KrF excimer laser unit replaced with an XeCl excimer laser unit, but also the second cap film 19 is changed as follows in the crystallizing apparatus 1 of FIG. 1. To obtain a lateral crystal growth distance of about 5 μm, an input fluence of 650 mJ/cm² is used on the black-circle curve obtained when the second cap insulating film 19 is composed of a silicon dioxide film, whereas an input fluence of 450 mJ/cm² is used on the white-box curve obtained when the second cap insulating film 19 is composed of a SiOx film.

The input fluence is reduced by about 30%. Therefore, the substrate to be crystallized 8 using the SiOx cap film of the present invention has the energy saving effect. Lowering the energy of the laser beam for crystallization makes it possible to lower the temperature of heat generated by the laser beam at the concave lens 3, convex lens 4, homogenizer 5, phase shifter 6, and projection lens 7 in the crystallizing apparatus 1, which produces the effect of alleviating the displacement of the optical image and the blurring of the focal point due to high temperatures. Even when the KrF excimer laser unit is used, in this embodiment, the second cap insulating film 19 is not composed of a silicon oxide film containing nitrogen. This produces the effect of eliminating nitrogen atom contamination in the process.

The amount of light reaching the Si surface can be adjusted according to the value of the absorption coefficient of the cap film 20. Setting the x value of the SiOx film with a suitable absorption coefficient to 2 or less enables lateral crystal growth at a low fluence, regardless of the wavelength of the laser beam from the excimer laser unit 2. An evaluation of crystallization has shown that both of the crystal grain size and the crystal orientation had sufficiently acceptable values when x was in the range of 1.4 to 1.9.

In FIG. 8, the black-circle curve is a crystallization characteristic curve of the substrate 8 to be crystallized where a silicon dioxide film was formed to a film thickness of 200 nm as the second cap insulating film 19. The white-box curve is a crystallization characteristic curve of the substrate 8 to be crystallized where an SiOx film (x is less than 2) was formed to a film thickness of 250 nm as the second cap insulating film 19.

In the embodiment, the first cap insulating film 18 has been formed thin and the cap 20 has been composed of the first and second cap insulating films 18, 19, or two layers. If the second cap insulating film 19 presents absorption properties to a crystallizing laser beam whose wavelength is 300 nm or more, it is possible to achieve crystallization with a large grain size even at room temperature as in the embodiment, which enables a crystallizing method of achieving power saving and decreasing the occurrence of the displacement of crystal grains.

Figure 13:
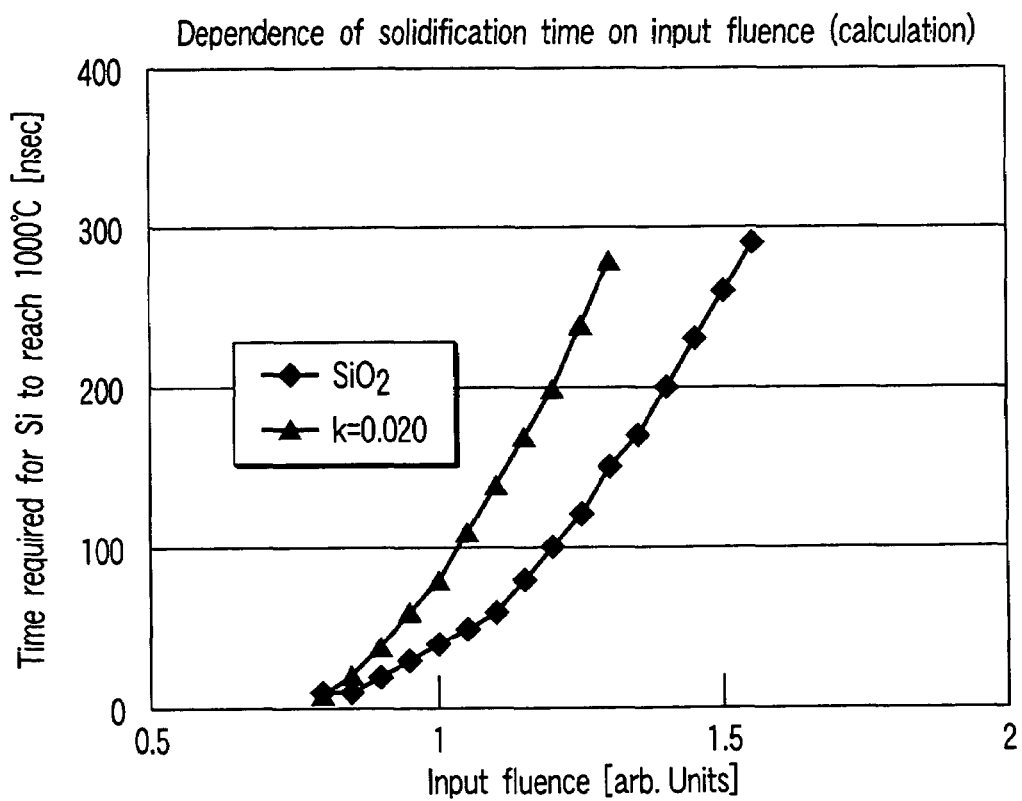
FIG. 13 is a characteristic curve diagram showing the energy saving effect by the second cap insulating film having the light absorption properties of FIGS. 3A and 3B in comparison with the characteristic of a conventional cap film.

FIG. 13 is a characteristic curve diagram of the time from immediately after laser irradiation until the amorphous semiconductor film 17 reaches 1000 degrees with respect to the input fluence of the crystallizing pulse laser beam irradiated onto the substrate 8 to be crystallized. The circle-symbol characteristic is a characteristic of the substrate 8 to be crystallized where the cap film 20 is composed only of the first cap film 18, the SiO₂ film is formed to a film thickness of 200 nm, the amorphous silicon film is formed to a film thickness of 200 nm, an SiO₂ film is formed to a film thickness of 30 nm as the substrate insulating film 16. The triangle-symbol characteristic is a characteristic of the substrate to be crystallized 8 where an SiO₂ film is formed to a film thickness of 30 nm as the first cap film 18, an SiOx film with extinction coefficient k=0.02 to a film thickness of 250 nm as the second cap film 18, an amorphous silicon film is formed to a film thickness of 200 nm, and an SiO₂ film is formed to a film thickness of 30 nm as the substrate insulating film 16.

The light absorption effect of the cap film 20 composed of the first and second cap films 18, 19 makes the solidification time longer. The solidification time correspond to the time from when the crystallizing pulse laser beam phase-modulated at the phase shifter 6 enters the amorphous semiconductor film 17, melting the irradiated region of the amorphous semiconductor film 17, which completes the irradiation period of the pulse laser beam, until the temperature of the melted region drops gradually and the position at which the solid-liquid separation temperature is reached moves in the melted region and the whole region is solidified. Lengthening the solidification time makes the lateral crystal growth length longer.

This is shown in FIG. 14. FIG. 14 shows that, if the lateral growth has progressed to position X1 at t=t1 after time t=t0, the position at which the solidification temperature Ts is crossed moves toward X1, showing that a continuous crystal grain is obtained at this point in time. If this phenomenon continues until t=t₂, long lateral growth with a single grain (in the crystallization region) is achieved. That is, to achieve long lateral growth, the temperature dropping rate should be smaller than the fastest lateral growth rate. What realizes the small temperature dropping rate is the effect of the cap layer 20 having the second cap insulating film 19.

It is seen from FIG. 14 that to achieve a long lateral growth requires the solidification time of the melted region to be extended. Providing the cap layer 20 with light absorption properties causes the solidification time to be extended. This effect will be explained, referring to FIGS. 15A to 15D. FIG. 15A shows the configuration of the substrate to be crystallized 8 of FIG. 3A where the cap layer 20 is composed only of an SiO₂ layer 18 formed to a film thickness of 130 nm. Specifically, the configuration of the substrate 8 of FIG. 15A is such that the film thickness of the SiO₂ film as the first cap layer 18 is 130 nm, the film thickness of the amorphous silicon film is 50 nm, and the film thickness of the SiO₂ film as the substrate insulating film 16 is 1000 nm. FIG. 15B shows the temperatures in the direction of depth of the substrate 8 to be crystallized 20 nsec (X1) after and 200 nsec (Y1) after the crystallizing pulse laser beam has entered the amorphous semiconductor film 17 and melted the irradiated region of the amorphous semiconductor film 17 and the irradiation period of the pulse laser beam has expired.

FIG. 15C shows the configuration of the substrate to be crystallized 8 provided with the first and second cap films 18, 19 shown in FIG. 3A. Specifically, the configuration of the substrate 8 of FIG. 15C is such that the film thickness of the SiO₂ film as the first cap layer 18 is 30 nm, the film thickness of the SiOx film as the second cap film 19 is 320 nm, the film thickness of the amorphous silicon film is 50 nm, and the film thickness of the SiO₂ film as the substrate insulating film 16 is 1000 nm. FIG. 15D shows the temperatures in the direction of depth of the substrate 8 to be crystallized 20 nsec (X2) after and 560 nsec (Y2) after the crystallizing pulse laser beam has been irradiated onto the substrate 8 and melted the irradiated region of the amorphous semiconductor film 17 and the irradiation period of the pulse laser beam has expired.

FIGS. 15A to 15D shows that the solidification time of the substrate 8 provided with only the SiO₂ layer 18 of 130 nm in thickness as the cap film 20 of FIG. 15A is 200 nsec, whereas the solidification time of the substrate 8 provided with the first and second cap films 18, 19 of FIG. 15C (FIG. 3A) is extended to 560 nsec. The substrate to be crystallized 8 of FIG. 15C (FIG. 3A) is the cap film 20 composed of the first and second cap films 18, 19, which makes the amount of heat stored larger and enables a longer solidification time to be secured.

The cap layer 20 having the second cap insulating film 19 has the function of storing as much heat as possible and a slow temperature dropping rate function. The second cap insulating function 19 of the cap layer 20 is composed of a film having light absorption properties. An example of the second cap insulating film 19 is SiOx (x<2.0). Ideally, the optical gap can be changed from Si (about 1.1 eV: x=0) to $SiO_2$ (about 9 eV: x=2). The absorption coefficient can be controlled to about 0 to $10^5$ cm$^{-1}$ with the wavelength of the laser used for crystallization, such as excimer laser. Particularly when x is in the range of $1.4 \leq x \leq 1.9$, a good crystal growth is verified.

FIG. 16 shows characteristic curves of the amount of light contributing to crystallization annealing with respect to the thickness of the cap layer 20 when, for example, an XeCl excimer laser beam whose wavelength is 308 nm as a crystallizing laser beam. In the characteristic curves, the lower one is a characteristic curve of a conventional cap film without light absorption. The upper curve is a characteristic curve of the light absorption effect produced by the SiOx film with k=0.02. A high usability of incident light is shown.

Here, k is an extinction coefficient (the imaginary part of the complex refractive index). The characteristic curve of FIG. 16 shows the effect of the SiOx film acting as a light absorption layer. As seen from FIG. 16, the cap layer 20 increases the usability of the incoming laser beam by the difference between the upper curve and the lower curve.

FIG. 17 is a characteristic curve diagram of the time from immediately after the laser is irradiated until the temperature of the amorphous semiconductor film 17 reaches 1000 degrees with respect to the film thickness of the first and second cap films 18, 19 constituting the cap film 20. In FIG. 17, the white boxes show a characteristic during the time from immediately after the laser beam is irradiated onto the $SiO_2$ layer serving as the first cap layer 18 until the temperature of the amorphous semiconductor film 17 reaches 1000 degrees. The black circles show a characteristic during the time from immediately after the laser beam is irradiated onto the SiOx layer serving as the second cap layer 19 until the temperature of the amorphous semiconductor film 17 reaches 1000 degrees.

Figure 9:
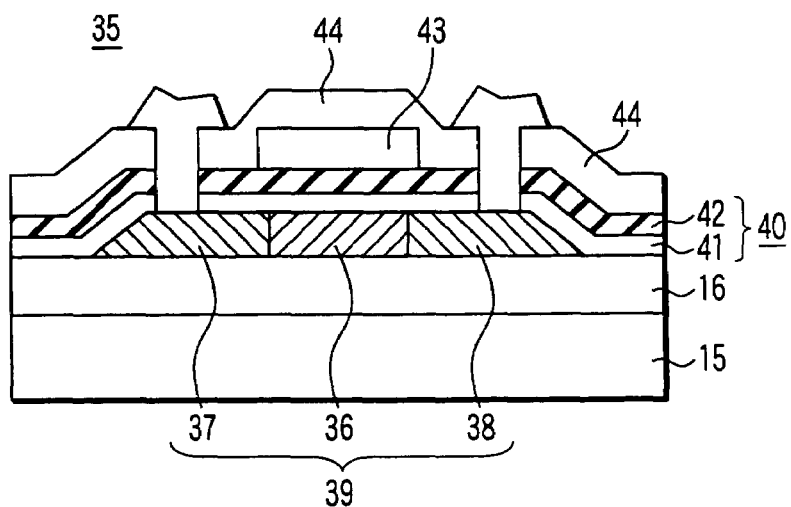
FIG. 9 is a cross-sectional view to help explain the process of forming a thin-film transistor in a crystallization region crystallized by the crystallizing apparatus of FIG. 1.

Next, the configuration of a thin-film transistor (TFT) formed in a crystallized region and a method of manufacturing the thin-film transistor will be explained, referring to FIG. 9. A thin-film transistor was produced using a substrate 8 to be crystallized which had a semiconductor film formed by the aforementioned crystallizing method so as to have large crystal grains. The same parts as those in FIGS. 1 to 8 and FIGS. 12 to 16 are indicated by the same reference numerals. A detailed explanation of them will be omitted.

A substrate protecting film 16 is formed on a substrate 15 made of insulating material or semiconductor, such as a low alkali glass substrate. The substrate protecting film 16 is an insulating film including silicon dioxide ($SiO_2$) or silicon nitride as a main component, such as a silicon dioxide film of 300 nm in film thickness. It is desirable that the substrate protecting film 16 should be formed in close contact with the glass substrate. The substrate protecting film 16 is a film which prevents impurities from diffusing from the substrate 15, such as a glass substrate to the amorphous semiconductor film.

On the substrate protecting film 16, an amorphous semiconductor film, or the amorphous semiconductor film 17 made of non-single-crystal semiconductor, such as an amorphous silicon film, is formed. The amorphous silicon film is an amorphous Si film of 200 nm in film thickness formed by, for example, plasma-enhanced chemical vapor deposition method.

On the amorphous silicon film, a cap film 20 with light absorption properties is formed, thereby forming a substrate 8 to be crystallized. The pulse laser beam homogenized by the homogenizer 5 of FIG. 4 is caused to enter the phase shifter 4 and is phase-modulated, thereby producing a pulse laser beam 12 with a light intensity profile which has a plurality of inverted triangular peak patterns in cross section of FIG. 2C. The laser beam 12 is irradiated onto the substrate to be crystallized 15, which completes the crystallization process.

Next, the first and second cap films 18, 19 on the crystallized amorphous semiconductor film 17 are removed by etching. Then, being aligned with the crystallized region of the exposed amorphous semiconductor film 17, a semiconductor circuit, such as a thin-film transistor 35 shown in FIG. 9, is fabricated as follows. First, to define the shape of an active region, patterning is done by photolithography, thereby forming a Si island with a predetermined specific pattern almost corresponding to a channel region 36, a source region 37, and a drain region 38 in the plane visual field. At this time, the channel region 36 is formed in the crystallized region.

Next, on the channel region 36, source region 37, and drain region 38, a gate insulating film 40 is formed. The gate insulating film 40, which is made mainly of silicon dioxide or silicon oxynitride (SiON), is a silicon dioxide film of 10 to 200 nm in thickness or a silicon oxynitride film of 30 to 500 nm in thickness. In the embodiment, a 3-nm-thick silicon dioxide film is provided on the side contacting silicon. On the silicon dioxide film 41, a silicon oxynitride film 42 is formed to a thickness of 50 nm using silane gas, ammonia gas, and nitrous oxide gas by plasma CVD techniques. On the silicon interface side, the silicon dioxide film 41 whose interface state density is low is used. On the film 41, the SiON film 42 with high permittivity is used to make leakage current smaller. The present invention is not limited to this. Use of only one layer does not depart from the spirit of the present invention. Although not shown in the embodiment, a film formed by oxidizing the surface of the Si island 39 by oxygen plasma may be used as the silicon dioxide film in the lower part of the gate insulating film 40.

Next, on the gate insulating layer 40, a conductive layer was formed to form a gate electrode 43. The conductive layer, which was mad mainly of such element as Ta, Ti, W, Mo, or Al, was formed by a known film forming method, such as sputtering or vacuum deposition techniques. For example Mo—W alloy was used. The gate electrode metal layer was patterned by photolithography, thereby forming a gate electrode 43 with a specific pattern.

Next, with the gate electrode 43 as a mask, impurities were implanted, thereby forming a source region 37 and a drain region 38. For example, to form a p-channel TFT, p-type impurities, such as boron ions, are implanted by ion implantation techniques. The boron concentration in this area was set to, for example, $1.5 \times 10^{20}$ to $3 \times 10^{21}$ cm$^{-3}$. In this way, a high-concentration p-type impurity region constituting the source region 37 and drain region 38 of the p-channel TFT is formed. It goes without saying that implanting n-type impurities at this time causes an n-channel TFT to be formed.

Next, a heat treatment process is carried out to activate the impurity elements implanted by the ion implantation. The process is carried out by furnace annealing, laser annealing, or rapid thermal annealing. In the embodiment, the activating process was performed by furnace annealing techniques. It is desirable that the heating process should be carried out in the temperature range of 300 to 650 degrees in an atmosphere of nitrogen. In the embodiment, the heat treatment was carried out at 500 decrees for four hours.

Next, an interlayer insulating film 44 was formed on the gate electrode 43 and gate insulating film 40. The interlayer insulating film 44 may be composed of a silicon nitride film, a silicon dioxide film, a silicon oxynitride film, or a stacked film of a combination of these films. The film thickness may be 200 to 600 nm. In the embodiment, the film thickness was 400 nm.

Next, contact holes are made in predetermined specific positions of the interlayer insulating film 44. Then, a conductive layer is formed inside the contact holes and on the surface of the interlayer insulating film 44. The conductive layer is patterned into a specific shape. In this embodiment, the source and drain electrodes 37, 38 were made of a stacked film of a three-layer structure made by forming a 100-nm-thick Ti film, a 300-nm-thick Ti-contained aluminum film, and a 150-nm-thick Ti film consecutively by sputtering techniques. In this way, a thin-film transistor 35 shown in FIG. 8 was formed.

Figure 10:
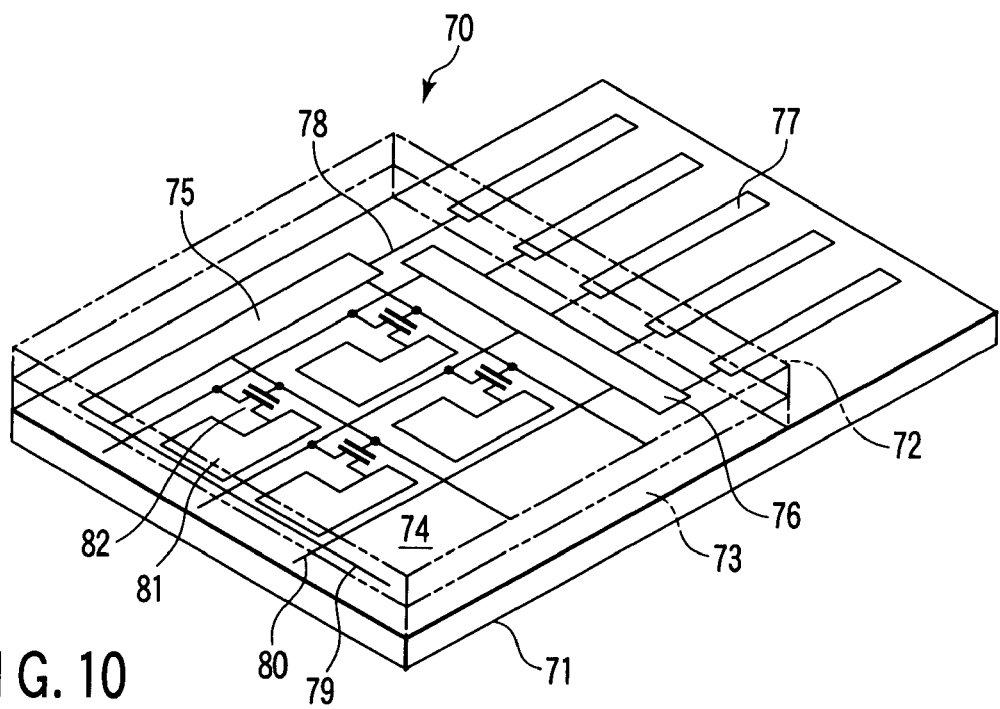
FIG. 10 is a perspective view of a display device to help explain the process of forming a display device using the thin-film transistor of FIG. 8.
Figure 11:
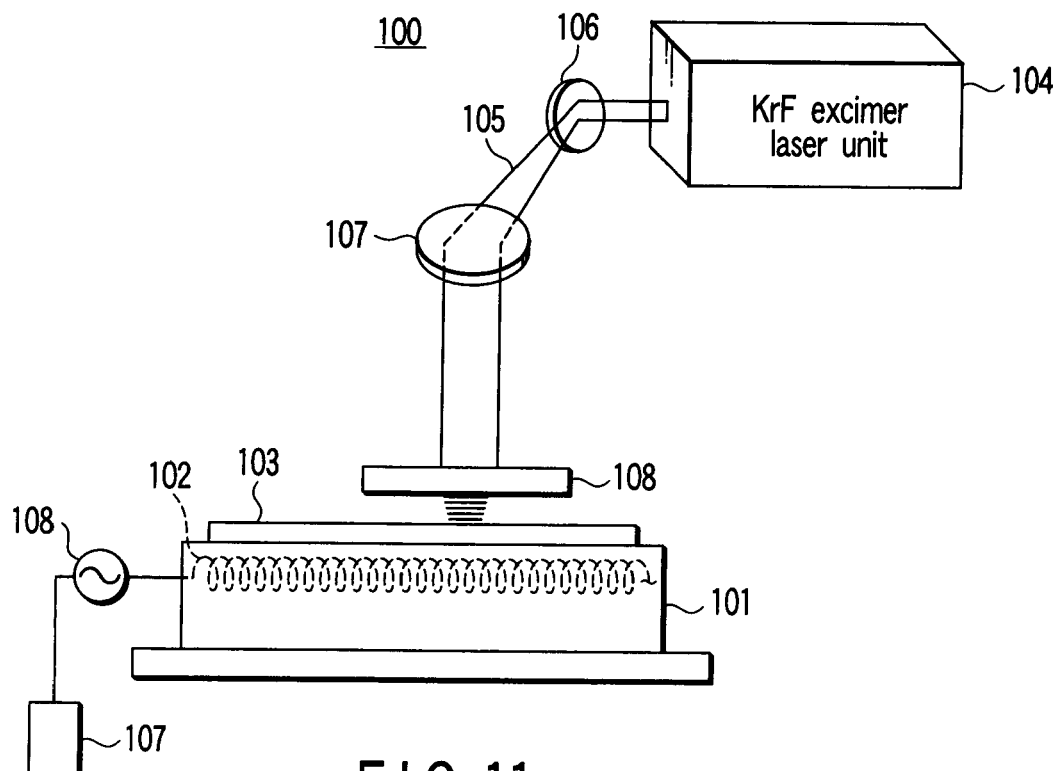
FIG. 11 is a diagram to help explain a conventional crystallizing apparatus.

Hereinafter, an example of actually applying a thin-film transistor obtained in the embodiment to an active matrix liquid-crystal display device will be explained. FIG. 10 shows an example of an active matrix display device using thin-film transistors. The display device 70 has a panel structure which includes a pair of insulating substrates 71, 72 and an electro-optic medium held between them. Liquid-crystal material is widely used as the electro-optic medium 73. At the lower insulating substrate 71, a pixel array section 74 and a driving circuit section are formed in an integrated manner. The driving circuit section is divided into a vertical driving circuit 75 and a horizontal driving circuit 76.

In the upper part of the periphery of the insulating substrate 71, terminal sections 77 for external connection are formed. The terminal sections 77 are connected to the vertical driving circuit 75 and horizontal driving circuit 76 via wiring lines 78. In the pixel array section 74, rows of gate wiring lines 79 and columns of signal wiring lines 80 are formed. At the intersections of both wiring lines, pixel electrodes 81 and thin-film transistors 82 to drive them are formed. The gate electrodes of the thin-film transistors 82 are connected to the corresponding gate wiring lines 79. The drain regions of the transistors 82 are connected to the corresponding pixel electrodes 81. The source regions of the transistors 82 are connected to the corresponding signal wiring lines 80. The gate wiring lines 79 are connected to the vertical driving circuit 75, whereas the signal wiring lines 80 are connected to the horizontal driving circuit 76.

The thin-film transistors 82 for switching the pixel electrodes 81 and the thin-film transistors included in the vertical driving circuit 75 and horizontal driving circuit 76, which have been produced according to the present invention, have a higher mobility than that of conventional equivalents. Therefore, not only the driving circuits but also higher-performance processing circuits may be formed in an integrated manner.

As described above, in the embodiment, since a pulse laser beam modulated so as to have a light intensity profile with a repetitive pattern where light intensity alternates between monotonous increase and monotonous decrease is irradiated onto a non-single-crystal semiconductor film, the high-order vibration components are decreased, which effectively suppresses the appearance of small-grain-diameter crystals caused by the vibration components. Moreover, the pulse laser beam is caused to enter from a light-absorption heat-generation film, raising the temperature of the semiconductor film to be crystallized by the pseudo substrate heating effect of the light-absorption heat-generation film, which promotes the lateral crystal growth, which makes it possible to form crystal grains with a large grain size closely.

Furthermore, even in the crystallization process, even at such a low temperature as room temperature and a temperature in the vicinity of room temperature (e.g., 5 to 50 degrees), crystallization with a large grain size can be achieved. In addition, laser beam energy can be realized with low fluence. As for energy of an incoming laser beam for crystallization, the crystallized region with the same lateral growth length could be obtained by a beam with half of the energy used for the crystallized substrate having a conventional structure or with three-fourth of the energy used for the crystallized substrate where only $SiO_2$ was provided with a cap film.

While in the embodiment, the light-absorbable second cap oxide film 19 has been an SiOx film (x is less than 2), it is desirable that x should be 1.4 to 1.9. An evaluation of crystallization has shown that both of the crystal grain diameter and the crystal orientation had sufficiently acceptable values when x was in the range of 1.4 to 1.9.

Furthermore, in the embodiment, for example, an XeCl excimer laser unit which emits a laser beam whose wavelength is 308 nm is used for the excimer laser unit 2. However, it confirms that similar good advantageous effect was provided by using a KrF excimer laser unit which emits a laser beam whose wavelength is 248 nm. It is desirable that the crystallization process by using the laser beam whose wavelength is equal to or less than 300 nm is achieved in permitted range of displacement caused by the blurring of the focal point due to heating of the optical system by the laser beam absorption.

Therefore, in another embodiment, a KrF excimer laser unit which emits a laser beam whose wavelength is 248 nm may be used for the excimer laser unit 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A crystallizing method of irradiating a laser beam onto an incident face of a non-single-crystal semiconductor film to crystallize the semiconductor film, the laser beam having a light intensity profile including a plurality of inverted triangular peak patterns in cross section, the crystallizing method comprising:

providing a cap film which presents properties of absorbing a part of the laser beam, on the incident face of the non-single-crystal semiconductor film, wherein the cap film is composed of at least one layer of silicon dioxide film and at least one layer of SiOx film and the SiOx film has a thickness of more than 150 nm (x is less than 2).

* * * * *